US012604561B2

(12) United States Patent
Lee

(10) Patent No.: US 12,604,561 B2
(45) Date of Patent: Apr. 14, 2026

(54) MIXED COLOR LIGHT EMITTING DEVICE

(71) Applicant: SEOUL VIOSYS CO., LTD., Ansan-si (KR)

(72) Inventor: Chung Hoon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 739 days.

(21) Appl. No.: 17/540,047

(22) Filed: Dec. 1, 2021

(65) Prior Publication Data

US 2022/0181516 A1 Jun. 9, 2022

Related U.S. Application Data

(60) Provisional application No. 63/250,890, filed on Sep. 30, 2021, provisional application No. 63/121,469, filed on Dec. 4, 2020.

(51) Int. Cl.
| | |
|---|---|
| *H10H 20/812* | (2025.01) |
| *H01L 25/075* | (2006.01) |
| *H10H 20/01* | (2025.01) |
| *H10H 20/821* | (2025.01) |
| *H10H 20/825* | (2025.01) |

(Continued)

(52) U.S. Cl.
CPC ....... *H10H 20/812* (2025.01); *H01L 25/0753* (2013.01); *H01L 25/0756* (2013.01); *H10H 20/018* (2025.01); *H10H 20/821* (2025.01); *H10H 20/8312* (2025.01); *H10H 20/8515* (2025.01); *H10H 20/857* (2025.01); *H10H 20/032* (2025.01); *H10H 20/0364* (2025.01);

(Continued)

(58) Field of Classification Search
CPC .... H01L 25/0753; H01L 27/15; H01L 27/153
See application file for complete search history.

(56) References Cited

U.S. PATENT DOCUMENTS

| | | |
|---|---|---|
| 6,914,262 B2 | 7/2005 | Hahm et al. |
| 7,514,720 B2 | 4/2009 | Kim et al. |

(Continued)

FOREIGN PATENT DOCUMENTS

| | | |
|---|---|---|
| EP | 2 843 705 B1 | 3/2020 |
| KR | 10-0631832 | 10/2006 |

(Continued)

OTHER PUBLICATIONS

International Search Report dated Mar. 14, 2022, issued to PCT/KR2021/018135.

(Continued)

*Primary Examiner* — Brian Turner
(74) *Attorney, Agent, or Firm* — Oblon, McClelland, Maier & Neustadt, L.L.P.

(57) ABSTRACT

A light emitting device including a first semiconductor stacked structure configured to emit multi-color light, and a red light source configured to emit red light, in which the first semiconductor stacked structure includes a first conductivity-type nitride semiconductor layer, an active layer disposed on the first conductivity-type nitride semiconductor layer, and a second conductivity-type nitride semiconductor layer disposed on the active layer, the active layer has a multi-quantum well structure including a plurality of barrier layers and a plurality of well layers stacked one over another, and the active layer is configured to emit multi-color light.

14 Claims, 18 Drawing Sheets

(51) Int. Cl.

| | |
|---|---|
| *H10H 20/831* | (2025.01) |
| *H10H 20/851* | (2025.01) |
| *H10H 20/857* | (2025.01) |

(52) U.S. Cl.
CPC ....... *H10H 20/825* (2025.01); *H10H 20/8512*
(2025.01)

(56) References Cited

U.S. PATENT DOCUMENTS

| | | | |
|---|---|---|---|
| 8,148,741 B2 | 4/2012 | Miller et al. | |
| 10,170,666 B2 | 1/2019 | Cha et al. | |
| 2005/0045894 A1* | 3/2005 | Okuyama | H10H 20/821 |
| | | | 257/95 |
| 2012/0012871 A1* | 1/2012 | Hsia | H01L 33/0093 |
| | | | 257/E33.068 |
| 2013/0082273 A1* | 4/2013 | Ting | H10H 20/0133 |
| | | | 438/46 |
| 2017/0186912 A1* | 6/2017 | Inoue | H10H 20/825 |

| | | | |
|---|---|---|---|
| 2018/0351039 A1* | 12/2018 | Kim | H10H 20/8252 |
| 2019/0164945 A1 | 5/2019 | Chae et al. | |
| 2019/0198709 A1* | 6/2019 | Wildeson | H01L 33/50 |
| 2019/0214373 A1 | 7/2019 | Kim et al. | |
| 2019/0296187 A1* | 9/2019 | Yoo | H10H 20/8162 |
| 2020/0184884 A1* | 6/2020 | Lau | H05B 45/10 |
| 2020/0194610 A1* | 6/2020 | Gao | H01L 31/145 |
| 2020/0243716 A1* | 7/2020 | Bergbauer | H10H 20/01335 |
| 2022/0393062 A1* | 12/2022 | Chen | H10H 20/816 |

FOREIGN PATENT DOCUMENTS

| | | |
|---|---|---|
| KR | 10-0691177 | 3/2007 |
| KR | 10-2017-0115142 | 10/2017 |
| KR | 10-2110446 | 5/2020 |

OTHER PUBLICATIONS

Extended European Search Report issued Sep. 23, 2024 in European
Patent Application No. 21901042.8, 9 pages.

* cited by examiner

1000e

1000f

1000g

1000h

MIXED COLOR LIGHT EMITTING DEVICE

CROSS-REFERENCE TO RELATED APPLICATIONS

This application claims the benefit of U.S. Provisional Patent Application No. 63/121,469, filed on Dec. 4, 2020, and U.S. Provisional Patent Application No. 63/250,890, filed on Sep. 30, 2021, each of which is hereby incorporated by reference for all purposes as if fully set forth herein.

BACKGROUND

Field

Exemplary embodiments of the invention relate generally to a light emitting device, and more specifically, to a mixed color light emitting device having a spectrum of multiple bands.

Discussion of the Background

Nitride semiconductors are mainly used for light emitting diodes or laser diodes that emit blue or green light as well as light sources for displaying apparatuses, traffic lights, lighting, or optical communication devices. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N-contact layer and a P-contact layer. The light emitting diode emits light of a specific wavelength depending on a composition of a well layer in the quantum well structure. To increase internal quantum efficiency and reduce losses from light absorption, a light emitting diode is generally designed to emit a spectrum of light having a single peak, i.e. monochromatic light. However, when the light source for general lighting emits mixed light, in which light of a plurality of wavelengths is mixed, it is difficult to implement the light source only with the monochromatic light emitting diode having the single peak. Accordingly, a plurality of light emitting diodes emitting different monochromatic lights together or a plurality of phosphors that converts the wavelength of light emitted from the light emitting diodes is generally used to implement mixed color light.

The above information disclosed in this Background section is only for understanding of the background of the inventive concepts, and, therefore, it may contain information that does not constitute prior art.

SUMMARY

Light emitting devices constructed according to exemplary embodiments of the invention are capable of emitting mixed color light with a novel structure.

Exemplary embodiments also provide a light emitting device emitting white light having a high color rendering index.

Additional features of the inventive concepts will be set forth in the description which follows, and in part will be apparent from the description, or may be learned by practice of the inventive concepts.

A light emitting device according to an exemplary embodiment includes a first semiconductor stacked structure configured to emit multi-color light, and a red light source configured to emit red light, in which the first semiconductor stacked structure includes a first conductivity-type nitride semiconductor layer, an active layer disposed on the first conductivity-type nitride semiconductor layer, and a second conductivity-type nitride semiconductor layer disposed on the active layer, the active layer has a multi-quantum well structure including a plurality of barrier layers and a plurality of well layers stacked one over another, and the active layer is configured to emit multi-color light.

The red light source may include a phosphor configured to convert a wavelength of light emitted from the first semiconductor stacked structure into red light.

The light emitting device may further include a printed circuit board, in which the first semiconductor stacked structure may be disposed on the printed circuit board.

Both of the first semiconductor stacked structure and the phosphor may be disposed at each of a plurality of locations on the printed circuit board.

The red light source may include a second semiconductor stacked structure configured to emit red light.

The second semiconductor stacked structure may be spaced apart from the first semiconductor stacked structure in a lateral direction.

The light emitting device may further include a printed circuit board, in which both of the first semiconductor stacked structure and the second semiconductor stacked structure may be disposed at each of a plurality of locations on the printed circuit board.

The second semiconductor stacked structure may be coupled to the first semiconductor stacked structure by a coupling layer.

The light emitting device may further include a substrate disposed on a side of the first semiconductor stacked structure, in which the multi-color light generated from the first semiconductor stacked structure and the red light generated from the second semiconductor stacked structure may be configured to be emitted to the outside of the light emitting device through the substrate.

The first semiconductor stacked structure and the second semiconductor stacked structure may be bonded by the coupling layer, and the coupling layer may include an insulation layer or a transparent electrode.

The light emitting device may further include a first bonding pad commonly electrically connected to the first semiconductor stacked structure and the second semiconductor stacked structure, and a second bonding pad and a third bonding pad electrically connected to the first semiconductor stacked structure and the second semiconductor stacked structure, respectively.

The second semiconductor stacked structure may include a first conductivity-type semiconductor layer and a second conductivity-type semiconductor layer, the first bonding pad may be commonly electrically connected to the first conductivity-type nitride semiconductor layer of the first semiconductor stacked structure and the first conductivity-type semiconductor layer of the second semiconductor stacked structure, the second bonding pad may be electrically connected to the second conductivity-type nitride semiconductor layer of the first semiconductor stacked structure, and the third bonding pad may be electrically connected to the second conductivity-type semiconductor layer of the second semiconductor stacked structure.

The light emitting device may further include buried vias electrically connecting the first, second, and third bonding pads to the first conductivity-type nitride semiconductor layer, the first conductivity-type semiconductor layer, the second conductivity-type nitride semiconductor layer, and the second conductivity-type semiconductor layer.

The multi-color light may include blue light and yellow light.

A method of manufacturing a light emitting device according to another exemplary embodiment includes the steps of preparing a first wafer by growing a first semiconductor stacked structure on a first substrate, preparing a second wafer by growing a second semiconductor stacked structure on a second substrate, and bonding the second wafer to the first wafer, in which the first semiconductor stacked structure includes a first conductivity-type nitride semiconductor layer, an active layer disposed on the first conductivity-type nitride semiconductor layer, and a second conductivity-type nitride semiconductor layer disposed on the active layer, in which the active layer has a multi-quantum well structure including a plurality of barrier layers and a plurality of well layers stacked one over another, the active layer is configured to emit multi-color light, and the second semiconductor stacked structure is configured to emit red light.

The method may further include the step of removing the first substrate or the second substrate.

The method may further include the step of forming bonding pads electrically connected to the first semiconductor stacked structure and the second semiconductor stacked structure, in which the second semiconductor stacked structure may include a first conductivity-type semiconductor layer and a second conductivity-type semiconductor layer, and the bonding pads may include a first bonding pad commonly connected to the first conductivity-type nitride semiconductor layer of the first semiconductor stacked structure and the first conductivity-type semiconductor layer of the second semiconductor stacked structure, a second bonding pad electrically connected to the second conductivity-type nitride semiconductor layer of the first semiconductor stacked structure, and a third bonding pad connected to the second conductivity-type semiconductor layer of the second semiconductor stacked structure.

The method may further include the step of forming buried vias for connecting the bonding pads to the first conductivity-type nitride semiconductor layer, the first conductivity-type semiconductor layer, the second conductivity-type nitride semiconductor layer, and the second conductivity-type semiconductor layer.

The first wafer and the second wafer may be bonded through a coupling layer, and the coupling layer may include an insulation layer or a transparent electrode.

The multi-color light may include blue light and yellow light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
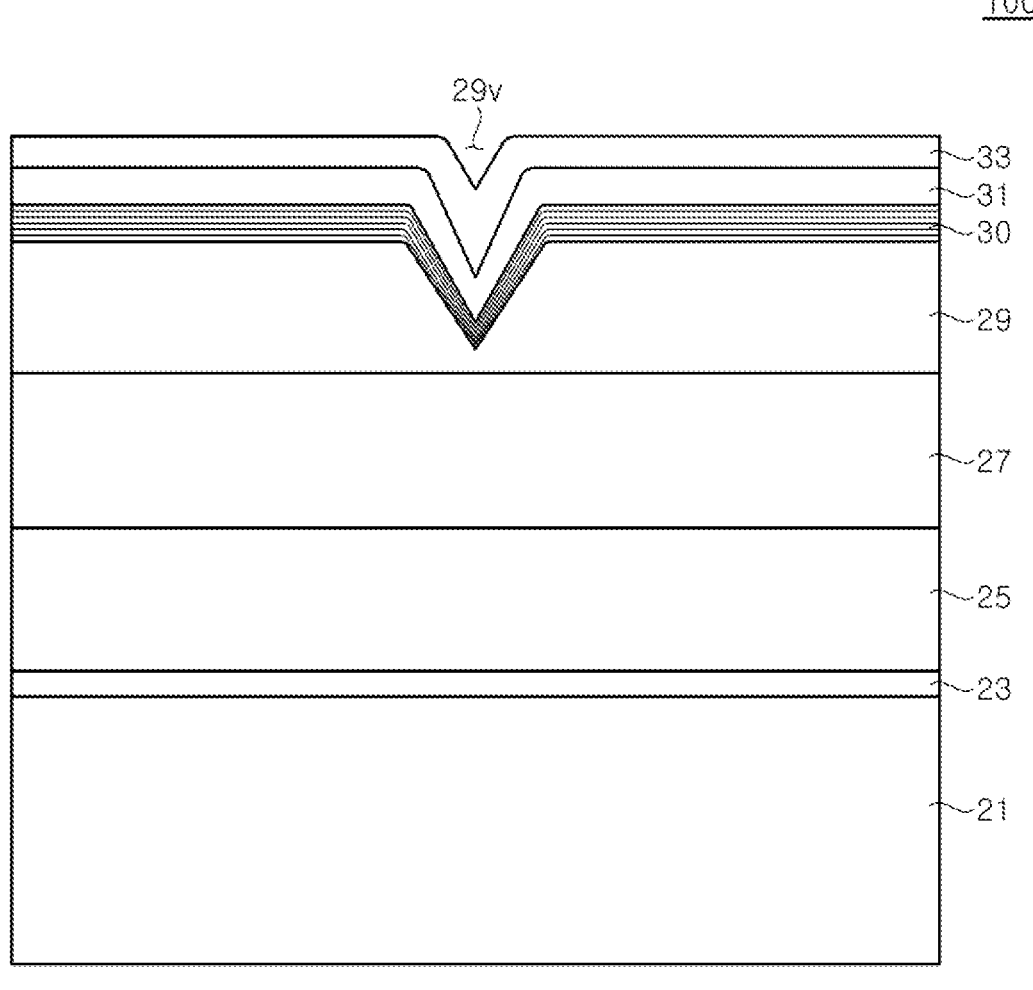
FIG. 1 is a schematic cross-sectional view of a first semiconductor stack structure in a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of a first semiconductor stack structure employed in a light emitting device according to an exemplary embodiment. The first semiconductor stacked structure may be provided as a light emitting diode chip 100.

Referring to FIG. 1, the light emitting diode chip 100 may include an n-type nitride semiconductor layer 27, a V-pit generation layer 29, an active layer 30, a p-type AlGaN layer 31, and a p-type nitride semiconductor layer 33. The light emitting diode chip 100 may also include a substrate 21, a nucleation layer 23, and a high-temperature buffer layer 25.

The substrate 21 may include a sapphire substrate, a SiC substrate, a Si substrate, a spinel substrate, or the like, and may be used to grow a gallium nitride-based semiconductor layer thereon. The substrate 21 may have a flat upper surface.

The nucleation layer 23 may include (Al, Ga)N, such as AlGaN or GaN, and may be formed on the substrate 21 at a low temperature of 400° C. to 600° C. A composition of the nucleation layer 23 may be modified depending on the substrate 21. For example, when the substrate 21 is a patterned sapphire substrate, the nucleation layer 23 may be formed of AlGaN, and when the substrate 21 is a sapphire substrate having a flat upper surface, the nucleation layer 23 may be formed of GaN. The nucleation layer 23 may be formed to have a thickness of, for example, about 25 nm, without being limited thereto.

The high-temperature buffer layer 25 may be grown at a relatively high temperature so as to mitigate an occurrence of defects, such as dislocations between the substrate 21 and the n-type nitride semiconductor layer 27. The high-temperature buffer layer 25 may be formed of undoped GaN or GaN doped with n-type impurities. While the high-temperature buffer layer 25 is being formed, threading dislocations may be generated due to a lattice mismatch between the substrate 21 and the high-temperature buffer layer 25. The high-temperature buffer layer 25 may be formed to have a thickness of, for example, about 4.2 μm, without being limited thereto.

The n-type nitride semiconductor layer 27 may be a nitride-based semiconductor layer doped with n-type impurities, for example, a GaN layer doped with Si. An Si may be doped into the n-type nitride semiconductor layer 27 at a concentration of $5E17/cm^2$ to $5E19/cm^2$. The n-type nitride semiconductor layer 27 may be grown under a growth pressure of 150 Torr to 200 Torr at 1000° C. to 1200° C. (e.g., 1050° C. to 1100° C.) by supplying a metal source gas into a chamber using MOCVD technology. In this case, the n-type nitride semiconductor layer 27 may be continuously formed on the high-temperature buffer layer 25, and the threading dislocations formed in the high-temperature buffer layer 25 may be transferred to the n-type nitride semiconductor layer 27. The n-type nitride semiconductor layer 27 may be formed to be relatively thinner than the high-temperature buffer layer 25. For example, the n-type nitride semiconductor layer 27 may have a thickness of about 2.5 μm, without being limited thereto.

The V-pit generation layer 29 is disposed over the n-type nitride semiconductor layer 27. In an exemplary embodiment, the V-pit generation layer 29 may be formed of, for example, a GaN layer. The V-pit generation layer 29 may be grown at a relatively lower temperature than that of the n-type nitride semiconductor layer 27, for example, about 900° C.

In this manner, V-pits may be formed in the V-pit generation layer 29.

Since the V-pit generation layer 29 is grown at a relatively lower temperature than that of the n-type nitride semiconductor layer 27, a crystal quality may be artificially reduced and a three-dimensional growth may be promoted to generate the V-pits 29v.

Figure 3:
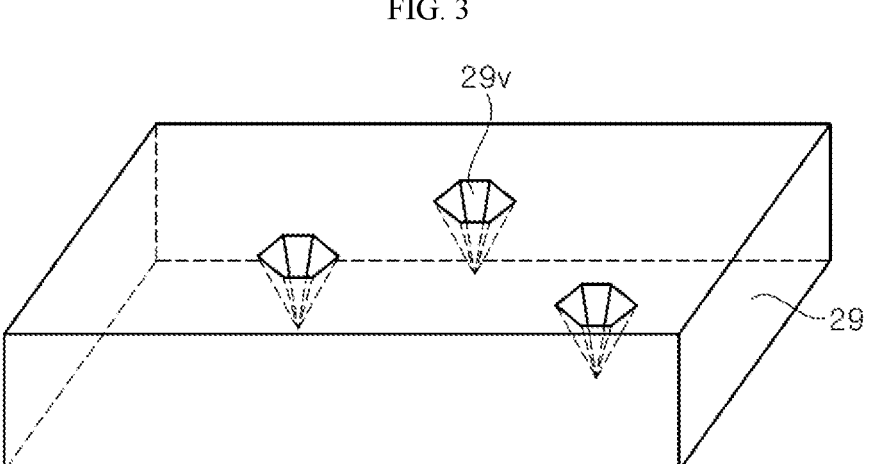
FIG. 3 is a schematic perspective view of an enlarged V-pit generation layer of a light emitting diode according to an exemplary embodiment.

As shown in FIG. 3, the V-pits 29v may have a hexagonal pyramid shape when a growth surface of the nitride semiconductor layer is a C-plane. The V-pits 29v may be formed at an upper end of the threading dislocation.

The V-pit generation layer 29 may be formed to have a thickness less than that of the n-type nitride semiconductor layer 27. For example, the V-pit generation layer 29 may have a thickness of about 450 nm to about 600 nm. Sizes of the V-pits 29v formed in the V-pit generation layer 29 may be controlled through growth conditions and growth time of the V-pit generation layer 29. In an exemplary embodiment, a maximum width of an inlet of the V-pit 29v formed in the V-pit generation layer 29 may generally exceed about 230 nm.

The thickness of the V-pit generation layer 29 may affect the size of the V-pit 29v, and the size of the V-pit 29v is considered to play a major role in generating multi-band spectral light. As used herein, the term the term multi-color light refers to a mixed light of visible light of a plurality of bands. For example, multi-color light may be mixed light of blue light and yellow light.

In the illustrated exemplary embodiment, the V-pit generation layer 29 is described as being a single layer, however, the inventive concepts are not limited thereto. In some exemplary embodiments, the V-pit generation layer 29 may be formed as multiple layers. For example, the V-pit generation layer 29 may include at least two of GaN, AlGaN, InGaN, or AlGaInN layers.

The active layer 30 is disposed on the V-pit generation layer 29. The active layer 30 emits light by recombination of electrons and holes. In addition, the active layer 30 may have a single quantum well structure or a multiple quantum well (MQW) structure, in which a barrier layer 30b and a well layer 30w are alternately stacked.

The active layer 30 may be in contact with the V-pit generation layer 29, but the inventive concepts are not limited thereto. The active layer 30 may be formed along the v-pit 29v. A thickness of the active layer 30 formed in the V-pit 29v is less than that of the active layer 30 formed on a flat surface of the V-pit generation layer 29. The thickness of the active layer 30 in the V-pit 29v may vary depending on a depth of the V-pit 29v. The thickness of the active layer 30 at an intermediate depth of the V-pit 29v may be about ⅓ or less of that of the active layer 30 formed on the flat surface of the V-pit generation layer 29. In particular, a thickness of the well layer 30w at the intermediate depth of the V-pit 29v may be about ⅓ or less of that of the well layer 30w formed on the flat surface of the V-pit generation layer 29.

The well layer 30w may be formed of $In_xAl_yGa_{1-x-y}N$ ($0<x<1$, $0≤y<1$). Composition ratio of In, Al, and Ga may be determined in consideration of required light. In particular, the well layer 30w (hereinafter, referred to as "a first well layer portion") formed on the flat surface of the V-pit generation layer 29 has a composition for emitting light of a longer-wavelength-side spectrum of multi-bands. On the other hand, the well layer 30w (hereinafter, referred to as "a second well layer portion") formed in the V-pit 29v has a composition for emitting light of a shorter-wavelength-side spectrum of the multi-bands. According to an exemplary embodiment, the first well layer portion may have a higher In composition ratio than the second well layer portion. For example, when the first and second well layers portions include InGaN, the first well layer portion may emit yellow light, and the second well layer portion may emit green and/or blue light by controlling the composition ratio of In.

The second well layer portion may be formed on surfaces of the V-pit 29v with a same composition as one another, but the inventive concepts are not limited thereto. In some exemplary embodiments, the second well layer portion may be formed on surfaces of the V-pit 29v with a different composition from one another. As such, the light emitting diode according to an exemplary embodiment may implement light having at least two bands at a single chip level using the first well layer portion and the second well layer portion.

The barrier layer 30b may be formed of a nitride semiconductor layer, such as GaN, InGaN, AlGaN, AlInGaN, or the like, which has a wider bandgap than that of the well layer 30w. For example, when the first well layer portion is formed of InGaN to emit yellow light, the barrier layer 30b may also be formed of InGaN but with a lower In content than that of the well layer 30w.

Figure 2A:
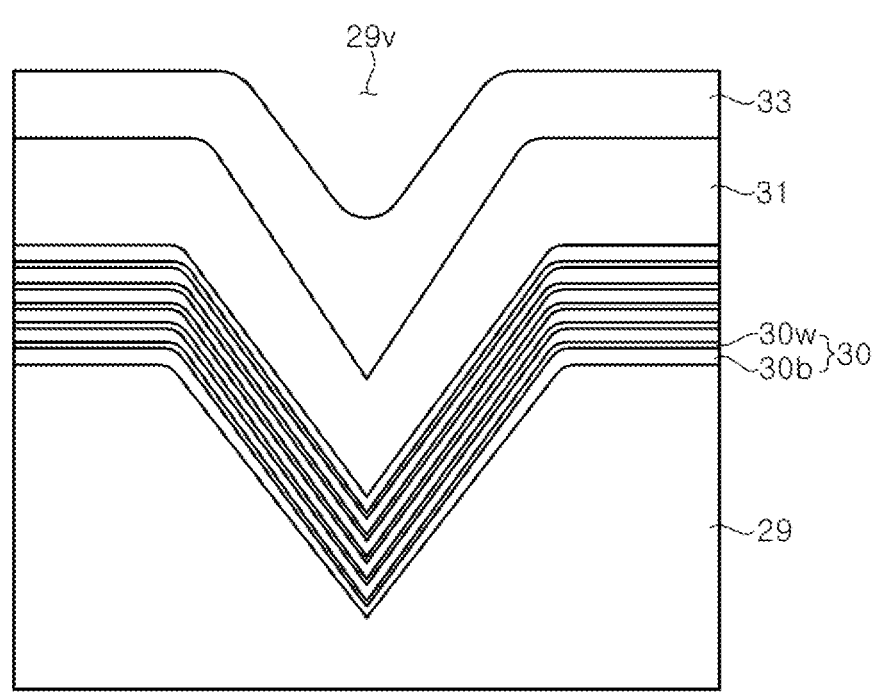
FIG. 2A is a partially enlarged view of the first semiconductor stack structure of FIG. 1 according to an exemplary embodiment.
Figure 2B:
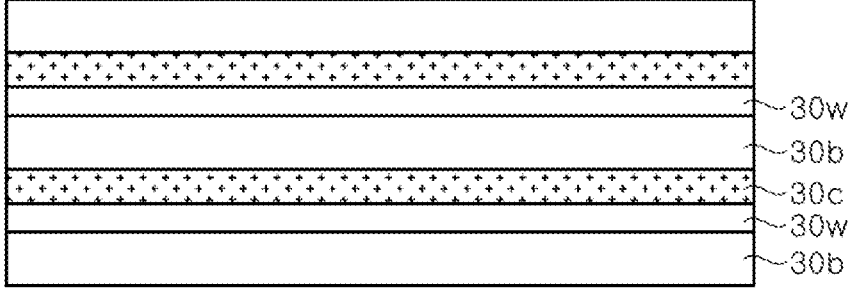
FIG. 2B is a partially enlarged view of the first semiconductor stack structure of FIG. 2A according to an exemplary embodiment.

Referring to FIG. 2B, a capping layer 30c may be interposed between the well layer 30w and the barrier layer 30b. The capping layer 30c may be formed prior to depositing the barrier layer 30b (e.g., an upper barrier layer 30b of FIG. 2B) on the well layer (e.g., a lower well layer 30w of FIG. 2B), to prevent dissociation of In in the well layer 30w during deposition of the barrier layer 30b. The capping layer 30c may include Al, for example, and may be formed of AlGaN or AlInGaN. The composition of Al in the capping layer 30c may be different between a first capping layer portion, i.e., a portion of the capping layer disposed over the flat surface of the V-pit generation layer 29 and a second capping layer portion, i.e., a portion of the capping layer formed in the V-pit 29v. An Al content in the first capping layer portion is greater than that in the second capping layer portion. For example, the Al composition in the first capping layer portion may be greater than or equal to 10 atomic percent, and further, greater than or equal to 12 atomic percent with respect to a total composition in the capping layer 30c, and the Al composition in the second capping layer portion may be greater than or equal to about 5 atomic percent with respect to the total composition in the capping layer 30c.

Remaining capping layers 30c other than the last capping layer 30c closest to the p-type nitride semiconductor layer 33 may be formed to have a thickness substantially similar to or less than that of the adjacent well layer 30w. The last capping layer 30c may be formed to be thicker than the well layer 30w adjacent thereto.

The p-type AlGaN layer 31 is disposed on the active layer 30. The p-type AlGaN layer 31 may also be formed in the V-pit 29v. The Al composition ratio in the p-type AlGaN layer 31 is relatively lower than the Al composition ratio used in an electron blocking layer. In addition, the Al composition ratio in the p-type AlGaN layer 31 may be lower than that in the capping layer 30c. For example, the p-type AlGaN layer 31 may be expressed by a general formula $Al_xGa_{1-x}N$, where x may be greater than 0 and less than 0.1. According to an exemplary embodiment, a thickness of the p-type AlGaN layer 31 may be less than about 100 nm, and in a specific exemplary embodiment, may be about 70 nm.

The p-type nitride semiconductor layer 33 may be formed of a semiconductor layer, for example, GaN, doped with p-type impurities, such as Mg. The p-type nitride semiconductor layer 33 may be formed as a single layer or multiple layers, and may include a p-type contact layer. As shown in FIG. 1, the p-type nitride semiconductor layer 33 may have a concave groove in the V-pit 29v. Since the V-pit 29v is not completely filled with the p-type nitride semiconductor layer 33, loss of light generated in the well layer 30w in the V-pit 29v may be prevented.

The light emitting diode chip 100 may be manufactured in various types well known in the art, such as a vertical type, a lateral type, a flip chip type, or the like. The light emitting diode chip 100 includes a first semiconductor stacked structure including the n-type nitride semiconductor layer 27, the active layer 30, and the p-type nitride semiconductor layer 33. In some exemplary embodiments, the substrate 21, the nucleation layer 23, and the high-temperature buffer layer 25 may be removed from the light emitting diode chip 100.

The light emitting diode chip 100 according to the illustrated exemplary embodiment may emit white light without a phosphor. Table 1 compares characteristics of white light generated in a light emitting diode package according to an exemplary embodiment and that generated in a conventional light emitting diode package. More particularly, 'multi-color LED' represents the light emitting diode package manufactured by mounting the light emitting diode chip 100 according to the illustrated exemplary embodiment in the housing and molding the light emitting diode chip 100 with a transparent molding member, and 'blue LED+phosphor' represents the conventional light emitting diode package that utilizes a conventional blue light emitting diode and a phosphor.

Referring to Table 1, it can be seen that white light using the light emitting diode chip 100 according to the illustrated exemplary embodiment has a relatively lower color rendering index (CRI), and lower correlated color temperature, as compared to those of white light using the conventional blue wavelength light emitting diode chip and the phosphor.

TABLE 1

| PKG@100 mA | X-coordinate | Y-coordinate | CRI | CCT/K |
|---|---|---|---|---|
| Blue LED + Phosphor | 0.34 | 0.35 | 85.2 | 5096 |
| Multi-color LED | 0.36 | 0.34 | 35.6 | 4264 |

Hereinafter, a configuration of a mixed color light emitting device for improving the color rendering of the light emitting diode chip 100 emitting multi-color light will be described in detail according to exemplary embodiments.

Figure 4:
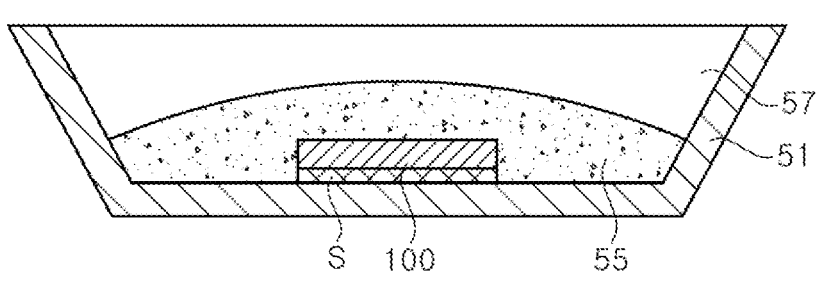
FIG. 4 is a schematic cross-sectional view of a mixed color light emitting device according to an exemplary embodiment.

FIG. 4 is a schematic a cross-sectional view of a mixed color light emitting device 200a according to an exemplary embodiment.

Referring to FIG. 4, the mixed color light emitting device 200a includes a light emitting diode chip 100 and a wavelength converter 55, and may include a housing 51 and a molding member 57.

The housing 51 may have leads for electrical connection, and may define a cavity therein. The light emitting diode chip 100 may be mounted in the cavity of the housing 51 and may be electrically connected to the leads. The light emitting diode chip 100 may be formed as a lateral light emitting diode chip, and may be mounted on the housing 51 using a solder paste S to be electrically connected to the leads by bonding wires. In some exemplary embodiments, the light emitting diode chip 100 may be formed as a vertical light emitting diode chip or a lateral light emitting diode chip. Since the light emitting diode chip 100 is similar to that described with reference to FIG. 1, repeated descriptions thereof will be omitted.

The wavelength converter 55 may be disposed in the cavity of the housing 51 to cover the light emitting diode chip 100. The wavelength converter 55 converts light emitted from the light emitting diode chip 100 into red light. The wavelength converter 55 may include one or more types of phosphors. Color rendering may be improved by using the light emitting diode chip 100 and the wavelength converter 55 together.

The wavelength converter 55 may include, for example, a red-based phosphor. The red-based phosphor may include, for example, a nitride, a sulfide, a fluoride, or an oxynitride-based phosphor, and specifically, may include CASN $(CaAlSiN_3:Eu^{2+})$, $(Ba,Sr,Ca)_2Si_5N_8:Eu^{2+}$, $(Ca,Sr)S_2:Eu^{2+})$, $(Sr,Ca)_2SiS_4:Eu^{2+}$, KSF $(K_2SiF_6:Mn^{4+})$, or the like. The red-based phosphor may also include an Mn(IV) activated phosphor expressed by a general formula $(A4-aBa)m/2+n/2X2m[MX_4O_2]n$ (A=H and/or D, in which D is heavy hydrogen; B=Li, Na, K, Rb, Cs, NH4, ND4, and/or NR4, in which R is an alkyl or aryl radical; X=F and/or Cl; M=Cr, Mo, W and/or Re; $0\leq a\leq 4$; $0<m\leq 10$; and $1\leq n\leq 10$). The red phosphor may have a peak wavelength within a range of 580 nm to 700 nm. In addition, the shape of the red phosphor may be varied. While some of the red-based phosphors are exemplarily described above, the inventive concepts are not limited to these phosphors. For example, the red-based phosphor may include quantum dots. Quantum dots may comprise or consist of at least one semiconductor material. Each quantum dot may comprise a core comprising a first semiconductor material and, optionally, at least one shell comprising a second different semiconductor material with the shell at least partly, preferably completely, surrounding the core. The semiconductor materials may comprise or consist of group II-VI, group III-V, group IV-VI, group and group II-IV-VI semiconductors as well as alloys or mixtures thereof, in particular CdSe, InAs, ZnSe, InP, GaP, CdS, ZnS, HgTe, PbSe, PbS as well as ternary and doped materials such as CuInS2 as well as alloys or mixtures thereof. The quantum dots may be spherical or rod-shaped and have a diameter between 2 nm inclusive and 20 nm inclusive, for example, 9×12 nm for a rod-shaped quantum dot.

The molding member 57 is formed in the cavity of the housing 51 to cover the wavelength converter 55. The molding member 57 is formed of a material transparent to visible light. In particular, the molding member 57 may be formed of methyl-based silicone or phenyl-based silicone, and, in particular, may be formed of phenyl-based silicone. The phenyl-based silicone has higher strength than the methyl-based silicone. In particular, in the illustrated exemplary embodiment, since visible light emitted from the light emitting diode chip 100 is converted into red light by the wavelength converter 55, it alleviates a yellowing phenomenon, and thus, the phenyl-based silicone may be used.

In the illustrated exemplary embodiment, the molding member 57 has been exemplarily described as being formed to cover the wavelength converter 55, but in some exemplary embodiments, the molding member 57 and the wavelength converter 55 may be integrally formed. More particularly, the wavelength converter 55 may include the molding member and the phosphor, and in this case, the molding member covering the wavelength converter may be omitted.

Figure 5A:
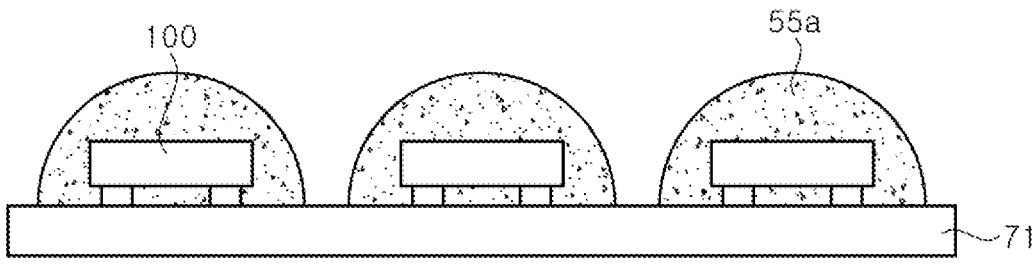
FIG. 5A is a schematic cross-sectional view of a mixed color light emitting device according to another exemplary embodiment.

FIG. 5A is a schematic cross-sectional view of a mixed color light emitting device 200b according to another exemplary embodiment.

Referring to FIG. 5A, the mixed color light emitting device 200b may include a printed circuit board 71, a plurality of light emitting diode chips 100, and wavelength converters 55a.

The printed circuit board 71 has circuits for supplying power to the light emitting diode chips 100. The printed circuit board 71 may have a circuit formed in a multi-layered structure therein, and may have pads connected to the circuit on a surface thereof.

The emitting diode chips 100 are arranged on the printed circuit board 71. The light emitting diode chips 100 may be bonded to the pads of the printed circuit board 71 using a bonding material. Each of light emitting diode chips 100 is similar to that described above with reference to FIG. 1, and thus, repeated descriptions thereof will be omitted. Although FIG. 5A exemplarily illustrates the light emitting diode chip 100 having a flip chip type, the inventive concepts are not limited thereto.

The light emitting diode chips 100 may be connected in various ways, such as in series, parallel, or series-parallel using the circuit in the printed circuit board 71, and may be driven individually or collectively.

The wavelength converters 55a cover the light emitting diode chips 100, respectively. The wavelength converters 55a include the red-based phosphor as described above with reference to FIG. 4. In the illustrated exemplary embodiment, although the wavelength converters 55a are illustrated and described as respectively covering the light emitting diode chips 100 in a dome shape, in some exemplary embodiments, a single wavelength converter may continuously cover the light emitting diode chips 100.

The wavelength converters 55a may be formed by dotting on each of the light emitting diode chips 100 after the light emitting diode chips 100 are mounted on the printed circuit board 71.

Figure 5B:
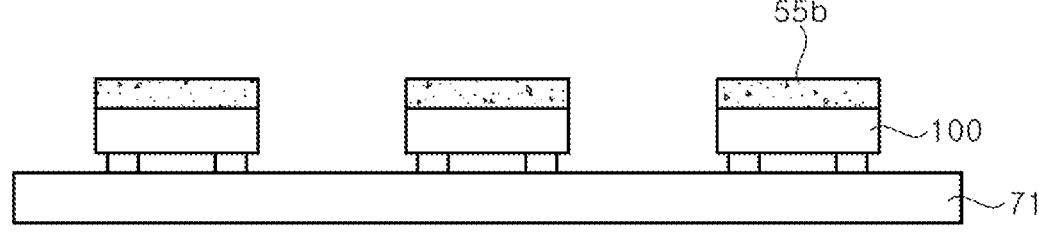
FIG. 5B is a schematic cross-sectional view of a mixed color light emitting device according to another exemplary embodiment.

FIG. 5B is a schematic cross-sectional view of a mixed color light emitting device according to another exemplary embodiment.

Referring to FIG. 5B, a mixed color light emitting device 200c according to the illustrated exemplary embodiment is substantially similar to the mixed color light emitting device 200b described with reference to FIG. 5A, except that wavelength converters 55b are limitedly disposed on light emitting diode chips 100, respectively.

In an exemplary embodiment, the wavelength converters 55b may have a larger area than that of the light emitting diode chip 100. The wavelength converter 55b may be stacked on the light emitting diode chip 100, and after the wavelength converter 55b is stacked, the light emitting diode chip 100 may be mounted on the printed circuit board 71 together with the wavelength converter 55b.

Figure 6:
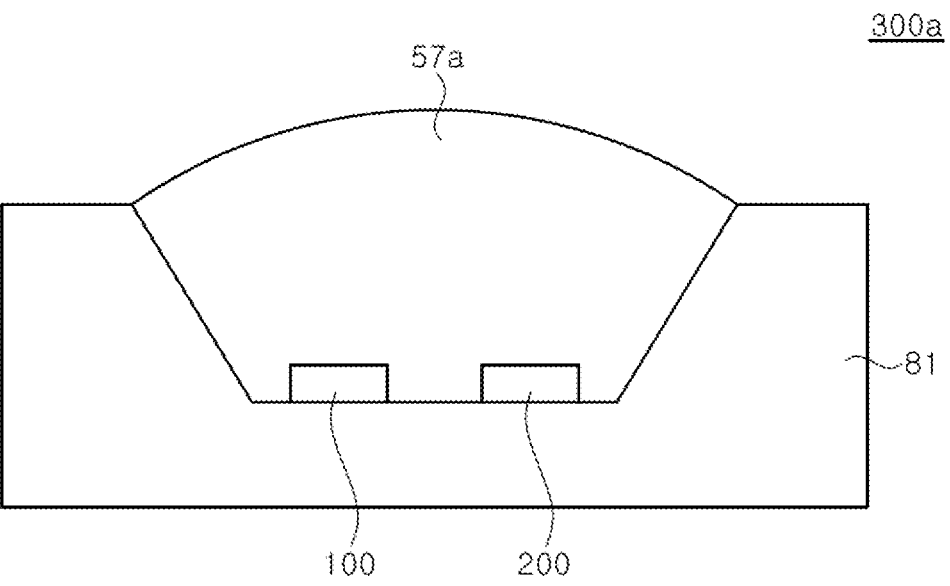
FIG. 6 is a schematic cross-sectional view of a mixed color light emitting device according to another exemplary embodiment.

FIG. 6 is a schematic cross-sectional view of a mixed color light emitting device 300a according to another exemplary embodiment.

Referring to FIG. 6, the mixed color light emitting device 300a includes a first light emitting diode chip 100 having a first semiconductor stacked structure and a second light emitting diode chip 200 having a second semiconductor stacked structure. The mixed color light emitting device 300a may also include a housing 81 and a molding member 57a.

The first semiconductor stacked structure emits multi-color light. Since the first light emitting diode chip 100 is substantially the same as that described with reference to FIG. 1, repeated descriptions thereof will be omitted.

The second light emitting diode chip 200 is a red light emitting diode chip emitting red light. The second semiconductor stacked structure includes a p-type semiconductor layer, an active layer, and an n-type semiconductor layer, in which these semiconductor layers include a semiconductor material capable of emitting red light. The second semiconductor stacked structure may include, for example, aluminum gallium arsenide (AlGaAs), gallium arsenide (GaAsP), aluminum gallium indium phosphide (AlGaInP), and gallium phosphide (GaP), without being limited thereto. The second light emitting diode chip 200 may also include a substrate. The second light emitting diode chip 200 may emit red light within a range of, for example, 580 nm to 700 nm.

The first and second light emitting diode chips 100 and 200 may be a lateral type, a vertical type, or a flip chip type, and may have the same structure or different structures from one another. Moreover, the first and second light emitting diode chips 100 and 200 may have the same height, but the inventive concepts are not limited thereto, and may have different heights form one another.

Meanwhile, the first and second light emitting diode chips 100 and 200 may be spaced apart from one another in a cavity of the housing 81, and may be covered with the molding member 57a. The molding member 57a may be formed of a transparent material that transmits visible light. In addition, the first and second light emitting diode chips 100 and 200 may be connected in series or parallel, and may be driven together or separately.

According to the illustrated exemplary embodiment, the mixed color light emitting device 300a having improved color rendering (CRI) may be provided by mounting the first light emitting diode chip 100 for emitting multi-color light and the second light emitting diode chip 200 for emitting red light together.

Figure 7:
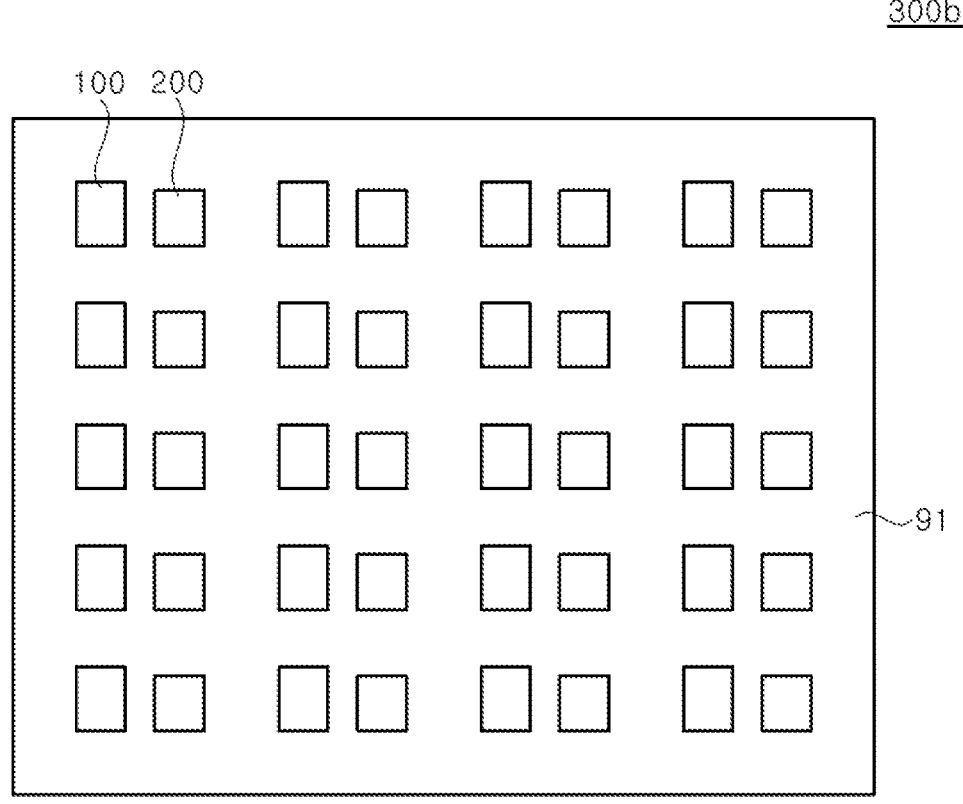
FIG. 7 is a schematic plan view of a mixed color light emitting device according to another exemplary embodiment.

FIG. 7 is a schematic plan view of a mixed color light emitting device 300b according to another exemplary embodiment.

Referring to FIG. 7, the mixed color light emitting device 300b includes a printed circuit board 91, a plurality of first light emitting diode chips 100, and a plurality of second light emitting diode chips 200, and may constitute a unit module.

The printed circuit board 91 has circuits for supplying power to the first and second light emitting diode chips 100 and 200. The printed circuit board 91 may have a circuit formed in a multi-layered structure therein, and may have pads connected to the circuit on a surface thereof.

The first and second light emitting diode chips 100 and 200 are arranged on the printed circuit board 91. The first light emitting diode chip 100 and the second light emitting diode chip 200 may be arranged to be adjacent to each other. The first and second light emitting diode chips 100 and 200 may be covered with a transparent molding member that transmits visible light.

In the illustrated exemplary embodiment, the mixed color light emitting device 300b may function as a surface light source by arranging the first and second light emitting diode chips 100 and 200 on the printed circuit board 91. As illustrated in the drawing, the first and second light emitting diode chips 100 and 200 may be arranged in a matrix, but the inventive concepts are not limited thereto, and may be arranged in a line to function as a bar-type light source.

A configuration of the mixed color light emitting device in which the above-described first semiconductor stacked structure and the second semiconductor stacked structure are coupled by a coupling layer is further described below. First, a basic structure of a mixed light emitting device according to exemplary embodiments will be described with reference to FIG. 8.

Figure 8:
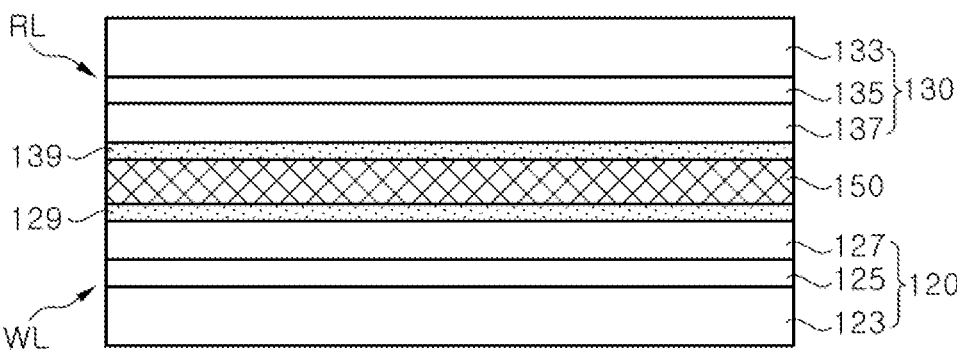
FIG. 8 is a schematic cross-sectional view of a basic structure of a mixed color light emitting device according to another exemplary embodiment.

FIG. 8 is a schematic cross-sectional view of a basic structure of the mixed color light emitting device according to an exemplary embodiment.

Referring to FIG. 8, the mixed color light emitting device according to the illustrated exemplary embodiment includes a first light emitting portion WL, a second light emitting portion RL, and an insulation layer 50. The first light emitting portion WL may include a first semiconductor stacked structure 120, and may further include a first transparent electrode 129. The second light emitting portion RL may include a second semiconductor stacked structure 130, and may further include a second transparent electrode 139.

The first semiconductor stacked structure 120 is substantially similar to the first semiconductor stacked structure described with reference to FIG. 1. In particular, the first semiconductor stacked structure 120 may include a first conductivity type semiconductor layer 123, an active layer 125, and a second conductivity type semiconductor layer 127, and moreover, may further include a V-pit generation layer and a p-type AlGaN layer. Since the first conductivity type semiconductor layer 123, the V-pit generation layer, the active layer 125, the p-type AlGaN layer, and the second conductivity type semiconductor layer 127 are substantially the same as the n-type nitride semiconductor layer 27, the V-pit generation layer 29, the active layer 30, the p-type AlGaN layer 31, and the p-type nitride semiconductor layer 33 described with reference to FIG. 1, respectively, repeated descriptions thereof will be omitted.

The second semiconductor stacked structure 130 may include a first conductivity type semiconductor layer 133, an active layer 135, and a second conductivity type semiconductor layer 137. Since the second semiconductor stacked structure 130 is substantially the same as the second semiconductor stacked structure of the second light emitting diode chip 200 described with reference to FIG. 6. In particular, since the first conductivity type semiconductor layer 133, the active layer 135, and the second conductivity type semiconductor layer 137 are substantially the same as the n-type semiconductor layer, the active layer, and the p-type semiconductor layer of the second light emitting diode chip 200 described above with reference to FIG. 6, respectively, repeated descriptions thereof will be omitted.

The first transparent electrode 129 may contact the second conductivity type semiconductor layer 127 of the first semiconductor stacked structure 120. The first transparent electrode 129 may be formed using a transparent conductive oxide (TCO) or a metallic layer. For example, the transparent conductive oxide layer may include, for example, $SnO_2$, $InO_2$, ITO, ZnO, IZO, or the like. The first transparent electrode 129 transmits light generated from the first semiconductor stacked structure 120 or the second semiconductor stacked structure 130.

The second transparent electrode 139 may contact the second conductivity type semiconductor layer 137 of the second semiconductor stacked structure 130. The second transparent electrode 139 may be formed using a transparent conductive oxide (TCO) or a metallic layer. The transparent conductive oxide layer may include, for example, $SnO_2$, $InO_2$, ITO, ZnO, IZO, or the like. The second transparent electrode 139 transmits light generated in the first semiconductor stacked structure 120 or the second semiconductor stacked structure 130.

An insulation layer 150 is disposed between the first light emitting portion WL and the second light emitting portion RL. The insulation layer 150 may couple the first light emitting portion WL and the second light emitting portion RL. For example, the insulation layer 150 may be interposed between the first transparent electrode 129 and the second transparent electrode 139.

The insulation layer 150 may be formed of a transparent organic material layer, or may be formed of a transparent inorganic material layer. The organic layer may include, for example, SUB, poly(methylmethacrylate), PMMA, polyimide, parylene, benzocyclobutene (BCB), or the like. The inorganic layer may include, for example, $Al_2O_3$, $SiO_2$, SiNx, or the like. In addition, the insulation layer 150 may be formed of spin-on-glass (SOG).

Figure 9:
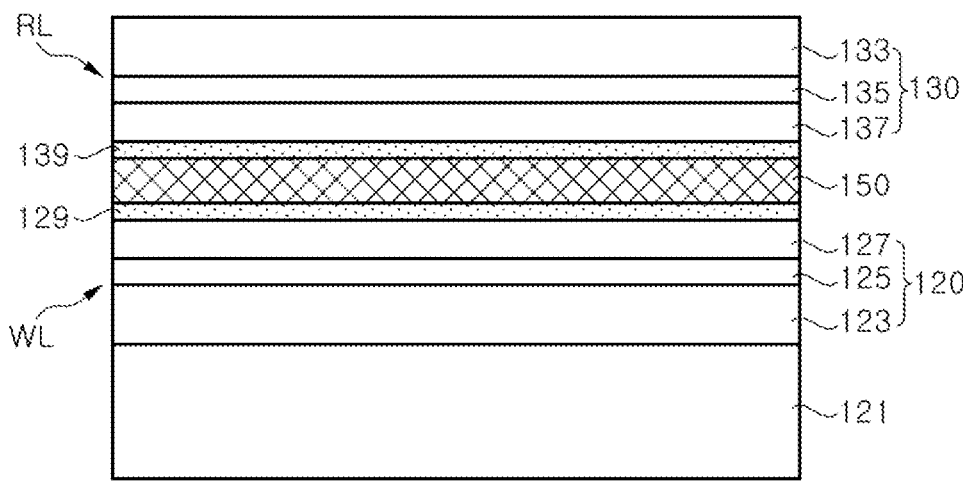
FIG. 9 is a schematic cross-sectional view of a basic structure of a mixed color light emitting device according to another exemplary embodiment.

In an exemplary embodiment, as shown in FIG. 9, the mixed color light emitting device may further include a first substrate 121. The first substrate 121 may be disposed on a side of the first light emitting portion WL. The first substrate 121 may be a substrate that can be used to grow the first semiconductor stacked structure 120, for example, a sapphire substrate, a SiC substrate, or a GaN substrate. In an exemplary embodiment, the first substrate 121 may be a flat sapphire substrate, but may also be a patterned sapphire substrate. In some exemplary embodiments, a nucleation layer and a high-temperature buffer layer described above with reference to FIG. 1 may be formed on the substrate 121.

Light generated from the first light emitting portion WL and the second light emitting portion RL may be emitted to the outside through the first substrate 121. As such, the first substrate 121 may be a transparent substrate that transmits light generated from the first light emitting portion WL and the second light emitting portion RL.

Figure 10:
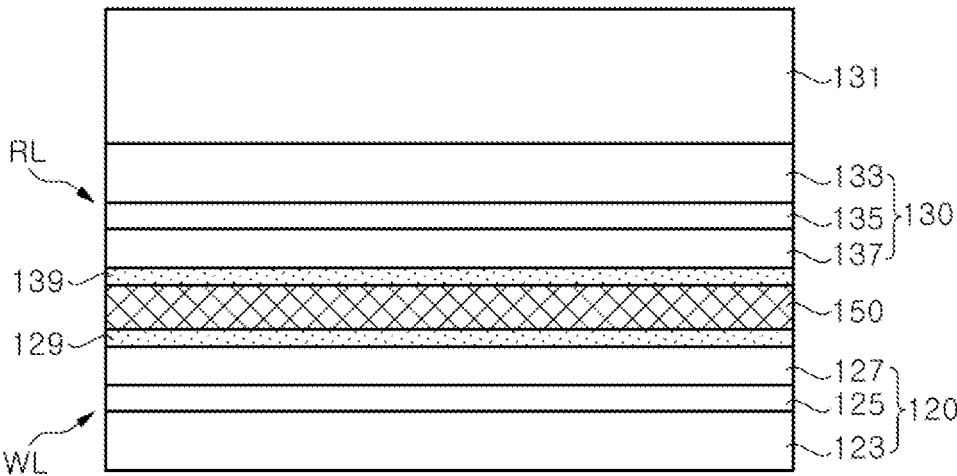
FIG. 10 is a schematic cross-sectional view of a basic structure of a mixed color light emitting device according to another exemplary embodiment.

In another exemplary embodiment, as shown in FIG. 10, the mixed color light emitting device may further include a second substrate 131. The second substrate 131 may be disposed on a side of the second light emitting portion RL. The second substrate 131 may be a substrate that can be used to grow the second semiconductor stacked structure 130, for example, a Si substrate, a GaAs substrate, or a GaP substrate. Light generated from the first light emitting portion WL and the second light emitting portion RL may be emitted in a direction facing away from the second substrate 131, and thus, the second substrate 131 may be an opaque substrate.

The mixed color light emitting device may be formed, for example, by bonding the first transparent electrode 129 and the second transparent electrode 139 to face each other using the insulation layer 150 after the first conductivity type semiconductor layers 123 and 133, the active layers 125 and 135, and the second conductivity type semiconductor layers 127 and 137 are grown on the first substrate 121 and the second substrate 131, respectively, and the first transparent electrode 129 and the second transparent electrode 139 are formed on the second conductivity type semiconductor layers 127 and 137, respectively. Thereafter, the light emitting device shown in FIG. 9 may be manufactured by separating the second substrate 131, or the light emitting device shown in FIG. 10 may be manufactured by separating the first substrate 121. Both the first substrate 121 and the second substrate 131 may be removed, and another substrate may be attached to the first light emitting portion WL or the second light emitting portion RL.

In some exemplary embodiments, before bonding the first transparent electrode 129 and the second transparent electrode 139, the first semiconductor stacked structure 120 or the second semiconductor stacked structure 130 may be patterned, and/or additional electrode pads may be formed on the first transparent electrode 129 or the second transparent electrode 139.

Figure 11:
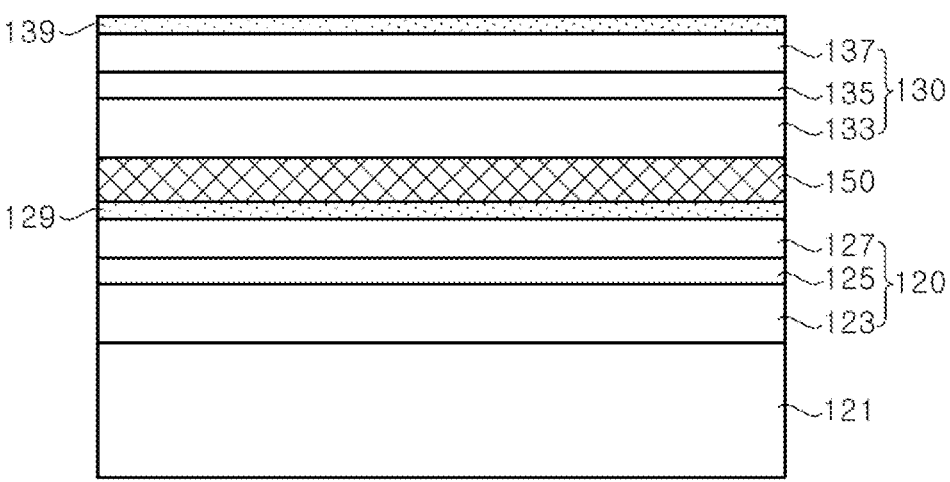
FIG. 11 is a schematic cross-sectional view of a basic structure of a mixed color light emitting device according to another exemplary embodiment.

FIG. 11 is a schematic cross-sectional view of a basic structure of a mixed color light emitting device according to another exemplary embodiment.

Referring to FIG. 11, the mixed color light emitting device according to the illustrated exemplary embodiment is substantially similar to the light emitting device of FIG. 10, except that an insulation layer 150 couples a first transparent electrode 129 and a first conductivity type semiconductor layer 133. An active layer 135 is disposed on the first conductivity type semiconductor layer 133, and a second conductivity type semiconductor layer 137 is disposed on the active layer 135. A second transparent electrode 139 may be disposed on the second conductivity type semiconductor layer 137.

In the illustrated exemplary embodiment, light generated in a second semiconductor stacked structure 130 may be emitted through a first substrate 121, and in this case, light may not need to travel through the second transparent electrode 139. Accordingly, a reflection metal layer may be disposed on the second conductivity type semiconductor layer 137 instead of the second transparent electrode 139 or in addition to the second transparent electrode 139.

The mixed color light emitting device according to the illustrated exemplary embodiment may be manufactured, for example, by coupling the second semiconductor stacked structure 130 and a first semiconductor stacked structure 120 after transferring the second semiconductor stacked structure 130 grown on a second substrate 131 and the second transparent electrode 139 to a temporary substrate, and separating the second substrate 131 first. The temporary substrate may be separated after the second semiconductor stacked structure 130 and the first semiconductor stacked structure 120 are coupled, and thus, the light emitting device may have the second transparent electrode 139 spaced apart from the insulation layer 150.

Figure 12:
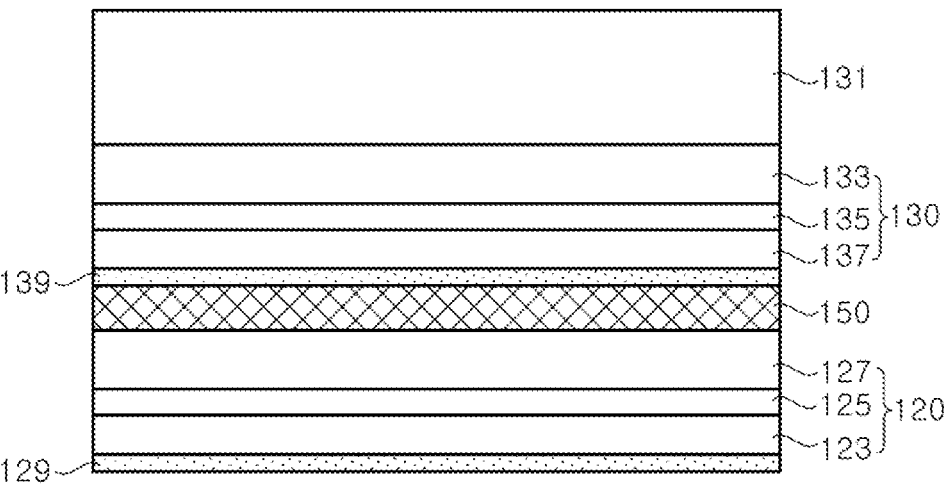
FIG. 12 is a schematic cross-sectional view of a basic structure of a mixed color light emitting device according to another exemplary embodiment.

In the illustrated exemplary embodiment, the light emitting device is described as illustrated as including the first substrate 121 while the second substrate 131 is removed. In some exemplary embodiments, through a similar process described with reference to FIG. 12, the second substrate 131 may be retained in the light emitting device while the first substrate 121 is removed. In the illustrated exemplary embodiment of FIG. 12, the second transparent electrode 139 may be transparent to light generated from the first semiconductor stacked structure 120 or the second semiconductor stacked structure 130. In addition, in the illustrated exemplary embodiment of FIG. 12, when light generated from the first semiconductor stacked structure 120 and the second semiconductor stacked structure 130 is emitted to the outside through the second substrate 131, a reflection metal layer may be disposed on the second conductivity type semiconductor layer 127 instead of the first transparent electrode 129 or in addition to the first transparent electrode 129.

Figure 13:
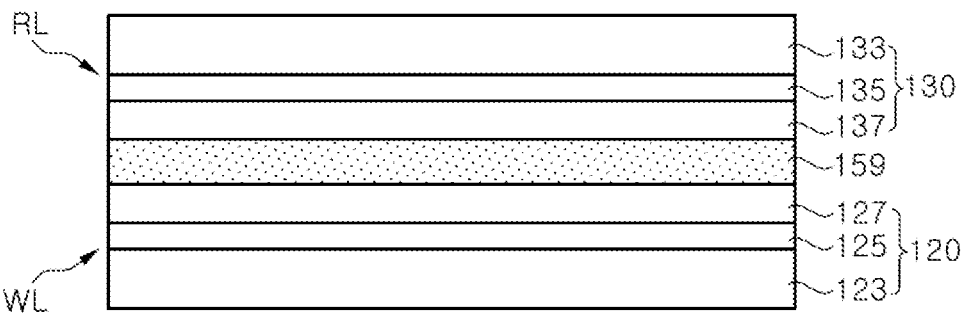
FIG. 13 is a schematic cross-sectional view of a basic structure of a mixed color light emitting device according to another exemplary embodiment.

FIG. 13 is a schematic cross-sectional view of a basic structure of a mixed color light emitting device according to another exemplary embodiment.

Referring to FIG. 13, the mixed color light emitting device according to the illustrated exemplary embodiment is substantially similar to the light emitting device described with reference to FIG. 8, except that a first light emitting portion WL and a second light emitting portion RL are coupled by a transparent electrode 159 instead of an insulation layer 150 shown in FIG. 8. For example, the transparent electrode 159 of FIG. 13 may be formed by directly bonding the first transparent electrode 129 and the second transparent electrode 139 of FIG. 9.

The transparent electrode 159 is commonly electrically connected to second conductivity type semiconductor layers 127 and 137, and thus, the second conductivity type semiconductor layer 127 of a first semiconductor stack structure 120 and the second conductivity type semiconductor layer 137 of a second semiconductor stack structure 130 are electrically connected to each other.

In some exemplary embodiments, a first substrate 121 may be disposed on a side of a first conductivity type semiconductor layer 123, and a second substrate 131 may be disposed on a side of a first conductivity type semiconductor layer 133.

As described above, the stacked structure of a mixed color light emitting device, in which the first light emitting portion WL and the second light emitting portion RL are coupled by the insulation layer 150 or the transparent electrode layer 159, according to exemplary embodiments have been described. The stacked structure of the mixed color light emitting device is not limited thereto, and other various configurations may also be possible. Meanwhile, electrodes may be disposed to supply external power to the first light emitting unit WL and the second light emitting portion RL. Hereinafter, mixed color light emitting devices having various structures in which electrodes are formed will be described in detail.

Figure 14:
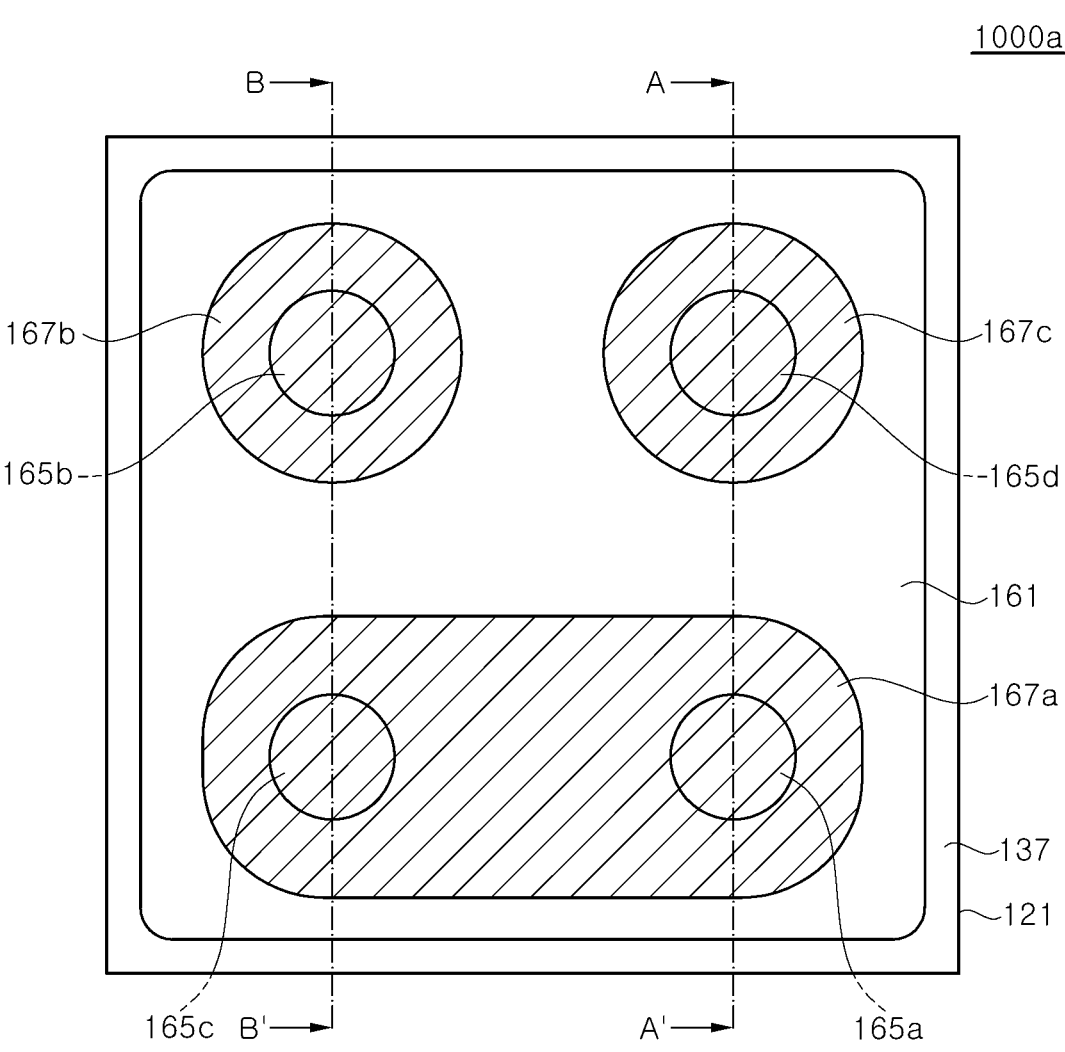
FIG. 14 is a schematic plan view of a mixed color light emitting device according to an exemplary embodiment.
Figure 15A:
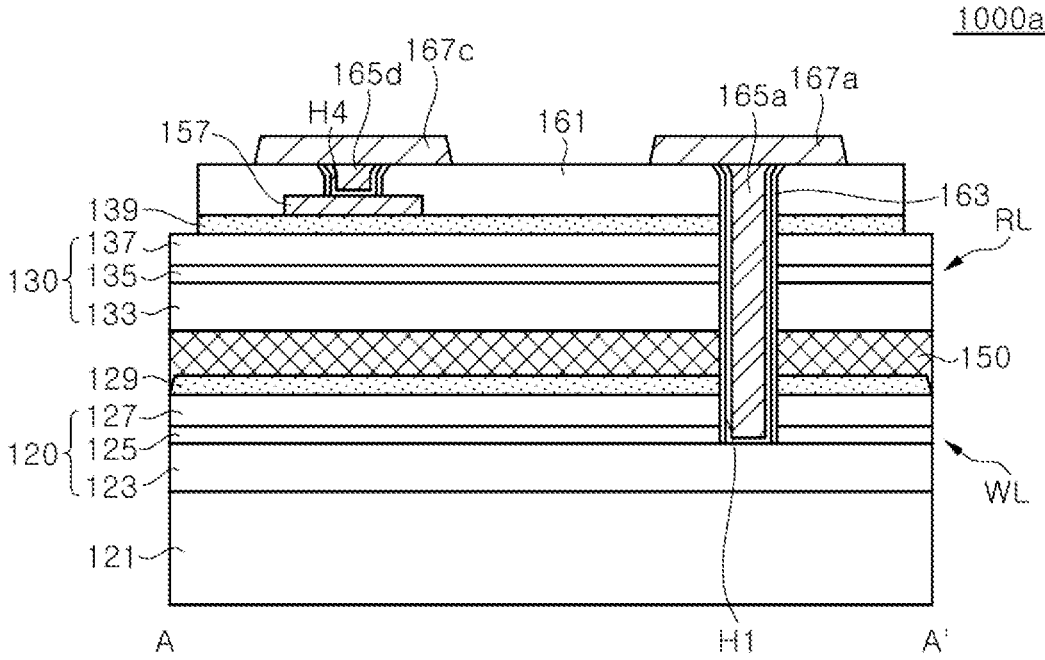
FIG. 15A is a schematic cross-sectional view taken along line A-A' of FIG. 14.
Figure 15B:
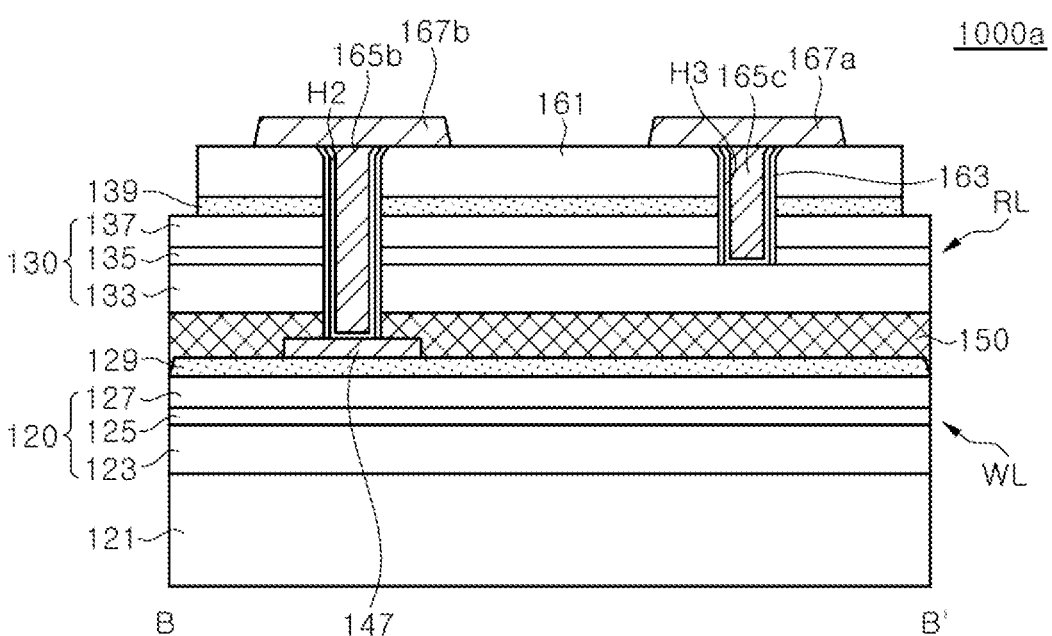
FIG. 15B is a schematic cross-sectional view taken along line B-B' of FIG. 14.

FIG. 14 is a schematic plan view of a mixed color light emitting device 1000a according to an exemplary embodiment, FIG. 15A is a schematic cross-sectional view taken along line A-A' of FIG. 14, and FIG. 15B is a schematic cross-sectional view taken along line B-B' of FIG. 14.

In the drawings, bonding pads 167a, 167b, and 167c are exemplarily illustrated and described as being disposed at an upper side of the mixed color light emitting device. In exemplary embodiments, however, the mixed color light emitting device may be flip-bonded on a circuit board or a lead frame, and in this case, the bonding pads 167a, 167b, and 167c are disposed at a lower side of the device.

Referring to FIGS. 14, 15A, and 15B, the mixed color light emitting device 1000a may include a first semiconductor stacked structure 120, a second semiconductor stacked structure 130, a first transparent electrode 129, and a second transparent electrode 139, a lower p-electrode pad 147, an upper p-electrode pad 157, an insulation layer 150, a planarization layer 161, a sidewall insulation layer 163, buried vias 165a, 165b, 165c, and 165d, and first, second, and third bonding pads 167a, 167b, and 167c.

Furthermore, the mixed color light emitting device 1000a may include through holes H1 and H2 passing through the second semiconductor stacked structure 130, a through hole H3 partially passing through the second semiconductor stacked structure 130, and a through hole H4 formed on the second semiconductor stacked structure 130.

In the mixed color light emitting device 1000a, a basic layer structure of the first light emitting portion WL and the second light emitting portion RL is similar to that described with reference to FIG. 11, but the lower p-electrode pad 147 and the upper p-electrode pad 157 may be added on the first transparent electrode 129 and the second transparent electrode 139, respectively.

As shown in FIGS. 15A and 15B, in the illustrated exemplary embodiment, the first and second semiconductor stacked structures 120 and 130 are vertically stacked. The first semiconductor stacked structure 120 is disposed on a substrate 121, and the second semiconductor stacked structure 130 is coupled to the first semiconductor stacked structure 120. Before the second semiconductor stacked structure 130 is coupled to the first semiconductor stacked structure 120, the lower p-electrode pad 147 may be formed on the first transparent electrode 129. The lower p-electrode pad 147 may be formed using, for example, a lift-off technique. The lower p-electrode pad 147 may be formed of a metallic layer. The lower p-electrode pad 147 may be formed of, for example, Cr/Au/Ti, but the incentive concepts are not limited thereto. In some exemplary embodiments, the lower p-electrode pad 147 may be omitted.

After the second semiconductor stacked structure 130 is grown on a second substrate, the second semiconductor stacked structure 130 may be bonded to the first semiconductor stacked structure 120 by the insulation layer 150 using a temporary bonding debonding (TBDB) technique. The second transparent electrode 139 may be formed before or after bonding the second semiconductor stacked structure 130 to the first semiconductor stacked structure 120.

The upper p-electrode pad 157 may be partially formed on the second transparent electrode 139. The upper p-electrode pad 157 may be formed of a metallic layer, and a material thereof is not particularly limited. The upper p-electrode pad 157 may be formed of the same material forming the lower p-electrode pad 147, without being limited thereto. The upper p-electrode pad 157 may be disposed not to overlap the lower p-electrode pad 147.

The planarization layer 161 may cover the second transparent electrode 139 and the upper p-electrode pad 157. The planarization layer 161 may have a flat upper surface. The planarization layer 161 is disposed on an upper region of a second conductivity type semiconductor layer 137. A side surface of the planarization layer 161 may be in flush with the second conductivity type semiconductor layer 137, but the inventive concepts are not limited thereto. For example, as shown in FIGS. 15A and 15B, a side surface of the planarization layer 161 may be recessed inwardly from an edge of the second semiconductor stacked structure 130.

Moreover, the side surface of the planarization layer 161 may be in flush with a side surface of the second transparent electrode 139. The planarization layer 161 may be patterned by photolithography and etching processes, and in this case, the second transparent electrode 139 may also be patterned. As such, the second conductivity type semiconductor layer 137 may be exposed around the planarization layer 161. The planarization layer 161 may be formed of an aluminum oxide film, a silicon oxide film, or a silicon nitride film.

The through holes H1, H2, H3, and H4 may be formed to provide an electrical path to the first light emitting portion WL and the second light emitting portion RL. The through holes H1, H2, H3, and H4 are spaced apart from one another. Since the through holes H1, H2, H3, and H4 have different depths form one another, they may be formed using different processes from one another.

The through hole H1 may pass through the planarization layer 161, the second transparent electrode 139, the second semiconductor stacked structure 130, the insulation layer 150, the first transparent electrode 129, a second conductivity type semiconductor layer 127, and an active layer 125, and may expose a first conductivity type semiconductor layer 123. The through hole H2 may pass through the planarization layer 161, the second transparent electrode 139, the second semiconductor stacked structure 130, and the insulation layer 150 to expose the lower p-electrode pad 147. The through hole H3 may pass through the planarization layer 161, the second transparent electrode 139, the second conductivity type semiconductor layer 137, and an active layer 135 to expose the first conductivity type semiconductor layer 123. The through hole H4 may pass through the planarization layer 161 to expose the upper p-electrode pad 157.

The sidewall insulation layer 163 covers sidewalls of the through holes H1, H2, H3, and H4, and has openings exposing bottoms of the through holes. The sidewall insulation layer 163 may be formed using, for example, a chemical vapor deposition technique or an atomic layer deposition technique, and may be formed of, for example, $Al_2O_3$, $SiO_2$, $Si_3N_4$, or the like. After the through holes H1, H2, H3, and H4 are formed, the sidewall insulation layer 163 may be formed to cover insides of the planarization layer 161 and the through holes H1, H2, H3, and H4. Then, the sidewall insulation layer formed on bottoms of the through holes may be removed through blanket etching, for example, to form openings that expose bottom surfaces thereof.

The buried vias 165a, 165b, 165c, and 165d may fill the through holes H1, H2, H3, and H4, respectively. The buried vias 165a, 165b, and 165c are insulated from inner walls of the through holes H1, H2, and H3 by the sidewall insulation layer 163, and thus, an electrical short is prevented.

The buried via 165a is electrically connected to the first conductivity type semiconductor layer 123 of the first semiconductor stacked structure 120. The buried via 165b may be electrically connected to the lower p-electrode pad 147, and may be electrically connected to the second conductivity type semiconductor layer 127 through the lower p-electrode pad 147 and the first transparent electrode 129. The buried via 165c may be electrically connected to the first conductivity type semiconductor layer 133 of the second semiconductor stacked structure 130, and the buried via 165d may be electrically connected to the upper p-electrode pad 157.

The buried vias 165a, 165b, 165c, and 165d may be formed using a chemical mechanical polishing technique. For example, after a seed layer is formed and the through holes H1, H2, H3, and H4 are filled with a conductive material, such as Cu using a plating technique, the buried vias 165a, 165b, 165c, and 165d may be formed by removing metallic layers on the planarization layer 161 using the chemical mechanical polishing technique. As shown in FIGS. 15A and 15B, the buried vias 165a, 165b, and 165c may have a relatively wider width at inlets of the through holes H1, H2, and H3 than at the bottom surfaces thereof, and thus, electrical connections may be strengthened. Meanwhile, the buried via 165d may have a pillar shape, in which upper and bottom surfaces have a substantially same size.

The buried vias 165a, 165b, 165c, and 165d may be formed together through an identical process. As such, the upper surfaces of the buried vias 165a, 165b, 165c, and 165d may be substantially flush with the planarization layer 161.

The bonding pads 167a, 167b, and 167c may be disposed on respective regions of the planarization layer 161. The first bonding pad 167a may be electrically connected to the buried via 165a, and may also extend in a lateral direction to be electrically connected to the buried via 165c. As such, the first conductivity type semiconductor layer 123 of the first semiconductor stacked structure 120 and the first conductivity type semiconductor layer 133 of the second semiconductor stacked structure 130 may be commonly electrically connected. The first bonding pad 167a may cover the buried vias 165a and 165c, as shown in FIG. 14.

The second bonding pad 167b is electrically connected to the buried via 165b. The second bonding pad 167b may cover the buried via 165b. The third bonding pad 167c is electrically connected to the buried via 165d. The third bonding pad 167c may cover the buried via 165d.

In the illustrated exemplary embodiment, each of the first, second, and third bonding pads 167a, 167b, and 167c is disposed on the planarization layer 161. The first, second, and third bonding pads 167a, 167b, and 167c may be formed together in an identical process, and thus, upper surfaces thereof may be disposed on the same plane.

In the illustrated exemplary embodiment, when the mixed color light emitting device 1000a is bonded to the circuit board or the like, the first, second, and third bonding pads 167a, 167b, and 167c may be bonded to pads of the circuit board by a bonding material, such as solder paste or the like. In some exemplary embodiments, bumps may be additionally formed on the first, second, and third bonding pads 167a, 167b, and 167c, and the mixed color light emitting device 1000a may be bonded to the circuit board using the bumps.

The mixed color light emitting device 1000a according to the illustrated exemplary embodiment may emit multi-color light using the first semiconductor stacked structure 120, and may emit red light using the second semiconductor stacked structure 130. Multi-color light has shorter wavelengths than that of red light. For example, multi-color light may be mixed light of blue light and yellow light. The mixed color light emitting device 1000a may implement mixed color light, for example, white light, by combination of multi-color light and red light, thereby improving color rendering.

Furthermore, by commonly electrically connecting the first conductivity type semiconductor layer 123 of the first semiconductor stacked structure 120 and the first conductivity type semiconductor layer 133 of the second semiconductor stacked structure 130, the first conductivity type semiconductor layers 123 and 133 may be electrically connected to one first bonding pads 167a. As such, the first semiconductor stacked structure 120 and the second semiconductor stacked structure 130 may be independently driven using three bonding pads 167a, 167, and 167c. Moreover, the buried vias 165a and 165b electrically connected to the first conductivity type semiconductor layer 123 and the second conductivity type semiconductor layer 127 of the first semiconductor stacked structure 120 are disposed in a diagonal direction in the mixed-color light emitting device 1000a. In addition, the buried vias 165c and 165d electrically connected to the first conductivity type semiconductor layer 133 and the second conductivity type semiconductor layer 137 of the second semiconductor stack structure 130 are disposed in the diagonal direction in the multi-color light emitting device 1000a. By disposing the buried vias 165a and 165b connected to the first semiconductor stacked structure 120 and the buried vias 165c and 165d electrically connected to the second semiconductor stacked structure 130 in the diagonal direction, it is possible to facilitate spreading of currents in the stacked structure 120 and the second semiconductor stacked structure 130, and thus, luminous efficiency may be increased.

In the illustrated exemplary embodiment, the first conductivity type semiconductor layer 123 of the first semiconductor stacked structure 120 and the first conductivity type semiconductor layer 133 of the second semiconductor stacked structure 130 are described as being commonly electrically connected, but the inventive concepts are not limited thereto. For example, in some exemplary embodiments, the second conductivity type semiconductor layer 127 of the first semiconductor stacked structure 120 and the second conductivity type semiconductor layer 137 of the second semiconductor stacked structure 130 may be commonly electrically connected. In this case, the first bonding pad 167a is divided to be respectively disposed on the buried vias 165a and 165c, respectively, and the second bonding pad 167b and the third bonding pad 167c are connected to each other, and thus, the second conductivity type semiconductor layer 127 of the first semiconductor stacked structure 120 and the second conductivity type semiconductor layer 137 of the second semiconductor stacked structure 130 may be commonly electrically connected.

In another exemplary embodiment, the second conductivity type semiconductor layer 127 of the first semiconductor stacked structure 120 and the second conductivity type semiconductor layer 137 of the second semiconductor stacked structure 130 may be electrically connected to one bonding pad. In this case, the first semiconductor stacked structure 120 and the second semiconductor stacked structure 130 may be driven together using two bonding pads.

Figure 16:
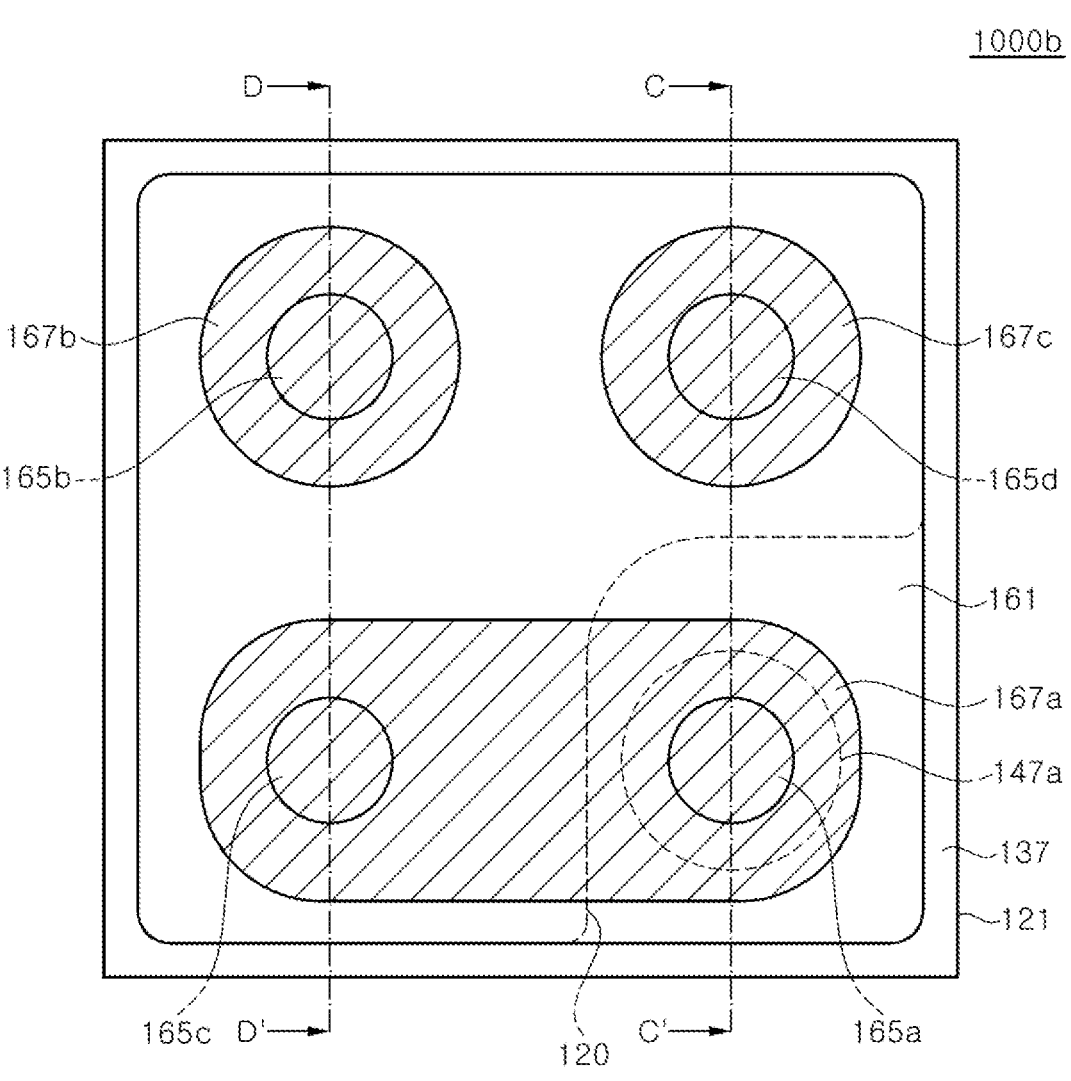
FIG. 16 is a schematic plan view of a mixed color light emitting device according to another exemplary embodiment.
Figure 17A:
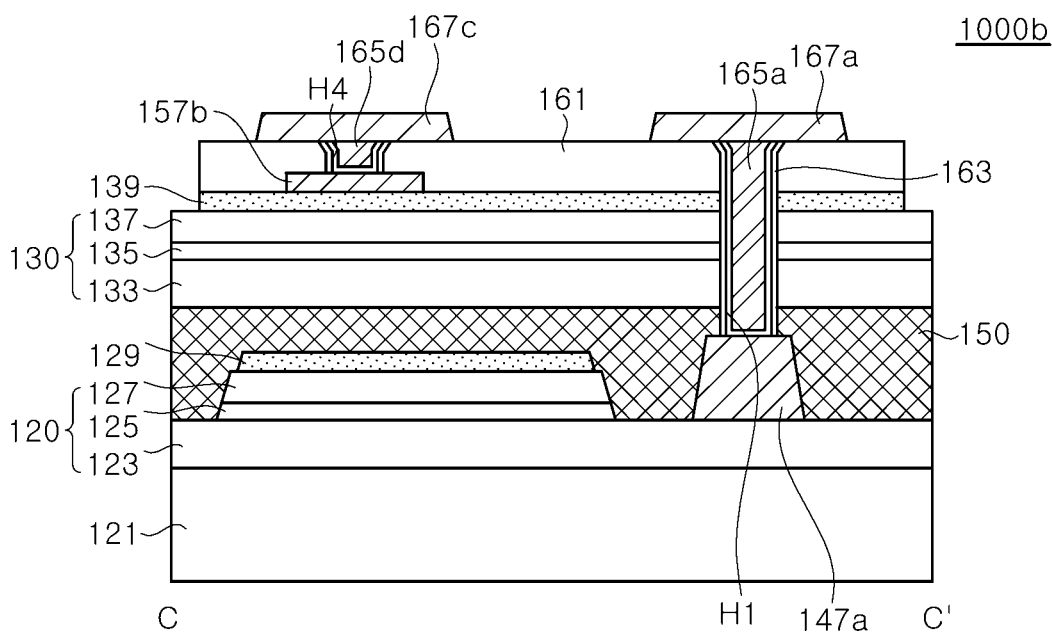
FIG. 17A is a schematic cross-sectional view taken along line C-C' of FIG. 16.
Figure 17B:
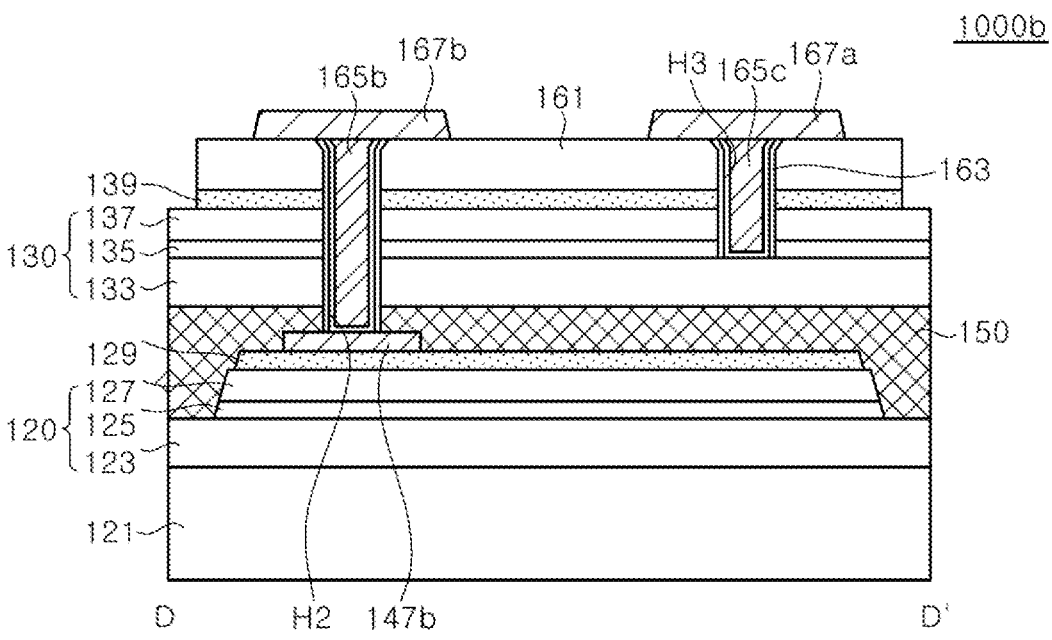
FIG. 17B is a schematic cross-sectional view taken along line D-D' of FIG. 16.

FIG. 16 is a schematic plan view of a mixed color light emitting device 1000b according to another exemplary embodiment, FIG. 17A is a schematic cross-sectional view taken along line C-C' of FIG. 16, and FIG. 17B is a schematic cross-sectional view taken along line D-D' of FIG. 16.

Referring to FIGS. 16, 17A, and 17B, the mixed color light emitting device 1000b according to the illustrated exemplary embodiment is substantially similar to the mixed color light emitting device 1000a described with reference to FIGS. 14, 15A, and 15B, except that a first semiconductor stacked structure 120 is patterned and a lower n-electrode pad 147a is further included.

More particularly, a first transparent electrode 129, a second conductivity type semiconductor layer 127, and an active layer 125 of the first semiconductor stacked structure 120 are patterned to expose a first conductivity type semiconductor layer 123. The lower n-electrode pad 147a may be formed on the exposed first conductivity type semiconductor layer 123. The lower n-electrode pad 147a may be formed of a material layer in ohmic contact with the first conductivity type semiconductor layer 123, for example, Cr/Au/Ti.

Meanwhile, a lower p-electrode pad 147b may be disposed on the first transparent electrode 129. A height of an upper surface of the lower p-electrode pad 147b may be substantially similar to that of an upper surface of the lower n-electrode pad 147a.

A through hole H1 may expose the lower n-electrode pad 147a instead of exposing the first conductivity type semiconductor layer 123. Since the height of the upper surface of the lower n-electrode pad 147a is substantially similar to that of the upper surface of the lower p-electrode pad 147b, through holes H1 and H2 may be formed together in an identical process.

In the illustrated exemplary embodiment, patterning of the first semiconductor stacked structure 120 may be carried out before the first semiconductor stacked structure 120 and a second semiconductor stacked structure 130 are coupled using an insulation layer 150. Accordingly, the insulation layer 150 may cover the exposed first conductivity type semiconductor layer 123, and may cover an upper surface of the first transparent electrode 129, and side surfaces of the first transparent electrode 129, the second conductivity type semiconductor layer 127, and the active layer 125.

In the illustrated exemplary embodiment, although patterning of the first semiconductor stacked structure 120 has been described, in some exemplary embodiments, the second semiconductor stacked structure 130 may also be patterned to expose the first conductivity type semiconductor layer 133, and an upper n-electrode pad may be formed on the exposed first conductivity type semiconductor layer 133. In addition, an upper p-electrode pad 157b may be disposed on a second transparent electrode 139. In this case, a height of an upper surface of the upper p-electrode pad 157b and a height of an upper surface of the upper n-electrode pad formed on the first conductivity type semiconductor layer 133 may be formed to be substantially similar, and thus, through holes H3 and H4 may also be formed together in an identical process.

Figure 18A:
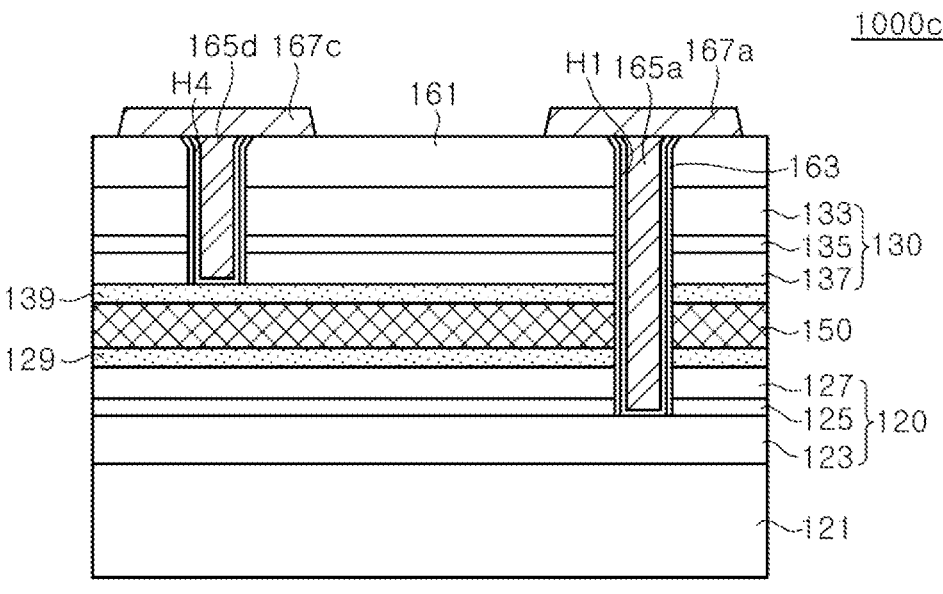
FIGS. 18A and 18B are schematic cross-sectional views of a mixed color light emitting device according to another exemplary embodiment.
Figure 18B:
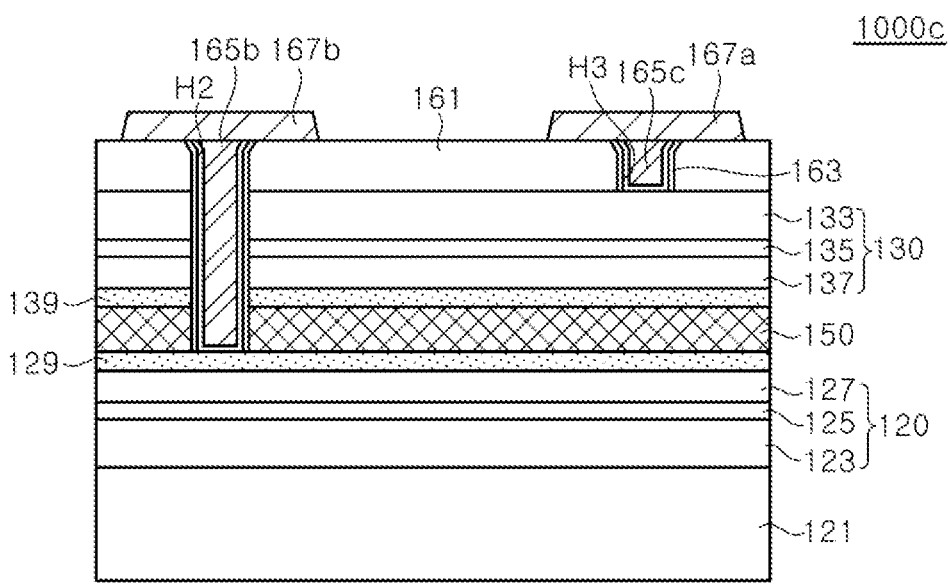

FIGS. 18A and 18B are schematic cross-sectional views of a mixed color light emitting device 1000c according to another exemplary embodiment.

Referring to FIGS. 18A and 18B, the mixed color light emitting device 1000c according to the illustrated exemplary embodiment is substantially similar to the mixed color light emitting device 1000a described with reference to FIGS. 14, 15A, and 15B, except that a second transparent electrode 139 is disposed on a surface of an insulation layer 150, and a first conductivity type semiconductor layer 133 is spaced apart from the insulation layer 150. A stacking order of a first semiconductor stacked structure 120, a second semiconductor stacked structure 130, a first transparent electrode 129, and the second transparent electrode 139 disposed on a first substrate 121 is similar to that of the light emitting device described above with reference to FIG. 9, and thus, repeated descriptions thereof will be omitted.

A planarization layer 161 covers the first conductivity type semiconductor layer 133. The planarization layer 161 may be formed of an aluminum oxide film, a silicon oxide film, or a silicon nitride film. As described above with reference to FIGS. 14, 15A, and 15B, in some exemplary embodiments, the planarization layer 161 may be recessed to expose an edge of the first conductivity type semiconductor layer 133.

In the illustrated exemplary embodiment, a through hole H1 may expose a first conductivity type semiconductor layer 123. In another exemplary embodiment, as described with reference to FIG. 16, the first semiconductor stacked structure 120 may be patterned and a lower n-electrode pad may be formed on the exposed first conductivity type semiconductor layer 123, and the through hole H1 may expose the lower n-electrode pad.

A through hole H2 may expose the first transparent electrode 129. In another exemplary embodiment, as described with reference to FIG. 14 or FIG. 16, a lower p-electrode pad may be disposed on the first transparent electrode 129, and the through hole H2 may expose the lower p-electrode pad.

A through hole H3 may expose the first conductivity type semiconductor layer 133. In some exemplary embodiments, an upper n-electrode pad may be added on the first conductivity type semiconductor layer 133, and the through hole H3 may expose the upper n-electrode pad. A through hole H4 may pass through the planarization layer 161 and the second semiconductor stacked structure 130, and may expose the second transparent electrode 139.

A sidewall insulation layer 163 may cover inner walls of the through holes H1, H2, H3, and H4, and expose bottom surfaces thereof. Moreover, as described above, buried vias 165a, 165b, 165c, and 165d may be formed in the through holes H1, H2, H3, and H4, respectively, and bonding pads 167a, 167b, and 167c may be disposed on the planarization layer 161 to cover the buried vias 165a, 165b, 165c, and 165d.

According to the illustrated exemplary embodiment, the first bonding pad 167a electrically connects the buried vias 165a and 165c, and thus, the first conductivity type semiconductor layers 123 and 133 of the first semiconductor stacked structure 120 and the second semiconductor stacked structure 130 are commonly electrically connected. Meanwhile, the second bonding pad 167b may be electrically connected to a second conductivity type semiconductor layer 127 through the buried via 165b and the first transparent electrode 129, and the third bonding pad 167c may be electrically connected to a second conductivity type semiconductor layer 137 through the buried via 165d and the second transparent electrode 139. In another exemplary embodiment, the second conductivity type semiconductor layers 127 and 137 of the first semiconductor stacked structure 120 and the second semiconductor stacked structure 130 may be commonly electrically connected, and the first conductivity type semiconductor layer 123 and 133 may be electrically isolated from each other. In another exemplary embodiment, the first conductivity type semiconductor layers 123 and 133 of the first semiconductor stacked structure 120 and the second semiconductor stacked structure 130 are commonly electrically connected, and the second conductivity type semiconductor layers 127 and 137 may also be commonly electrically connected.

Figure 19A:
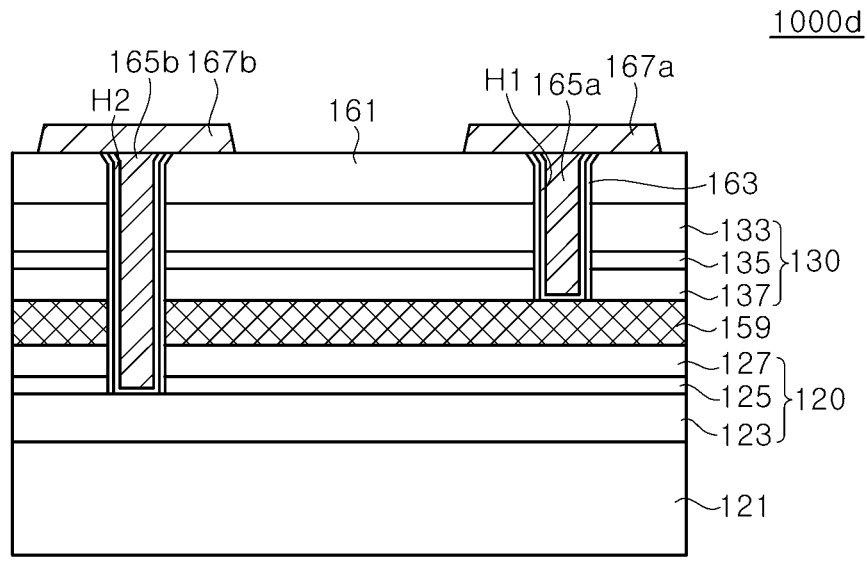
FIGS. 19A and 19B are schematic cross-sectional views of a mixed color light emitting device according to another exemplary embodiment.
Figure 19B:
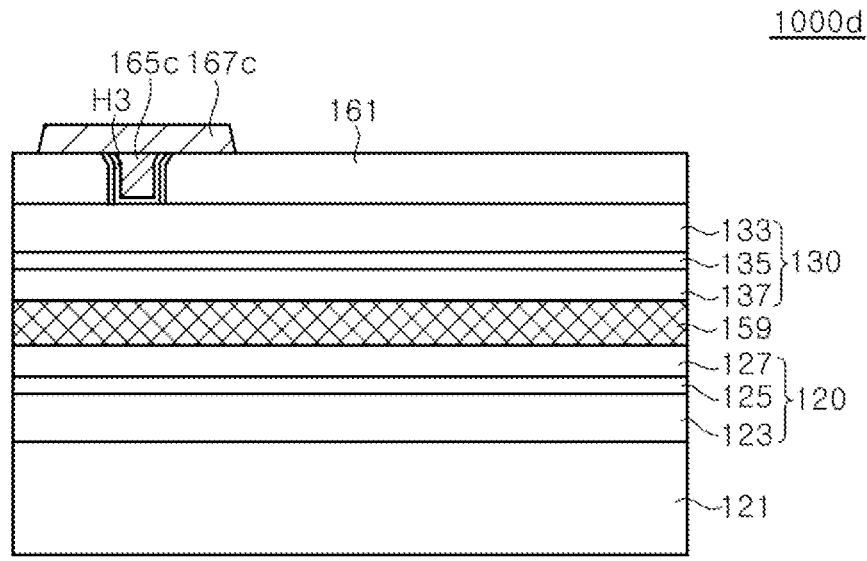

FIGS. 19A and 19B are schematic cross-sectional views of a mixed color light emitting device 1000d according to another exemplary embodiment.

Referring to FIGS. 19A and 19B, the mixed color light emitting device 1000d according to the illustrated exemplary embodiment includes a transparent electrode 159 coupling a first semiconductor stacked structure 120 and a second semiconductor stacked structure 130. In particular, the first semiconductor stacked structure 120 and the second semiconductor stacked structure 130 are bonded to each other by the transparent electrode 159. The transparent electrode 159 is commonly electrically connected to a second conductivity type semiconductor layer 127 of the first semiconductor stacked structure 120 and a second conductivity type semiconductor layer 137 of the second semiconductor stacked structure 130.

A through hole H1 exposes the transparent electrode 159, a through hole H2 exposes a first conductivity type semiconductor layer 123, and a through hole H3 exposes a first conductivity type semiconductor layer 133. In the illustrated exemplary embodiment, the mixed color light emitting device 1000d may have three through holes H1, H2, and H3, and a fourth through hole H4 may be omitted.

As described above, a sidewall insulation layer 163 may be formed, buried vias 165a, 165b, and 165c may be formed in the through holes H1, H2, and H3, and bonding pads 167a, 167b, and 167c may be formed on a planarization layer 161.

In the illustrated exemplary embodiment, the first bonding pad 167a may be commonly electrically connected to the second conductivity type semiconductor layers 127 and 137 through the transparent electrode 159, and the second and third bonding pads 167b and 167c may be electrically connected to the first conductivity type semiconductor layer 123 and the first conductivity type semiconductor layer 133, respectively.

Figure 20:
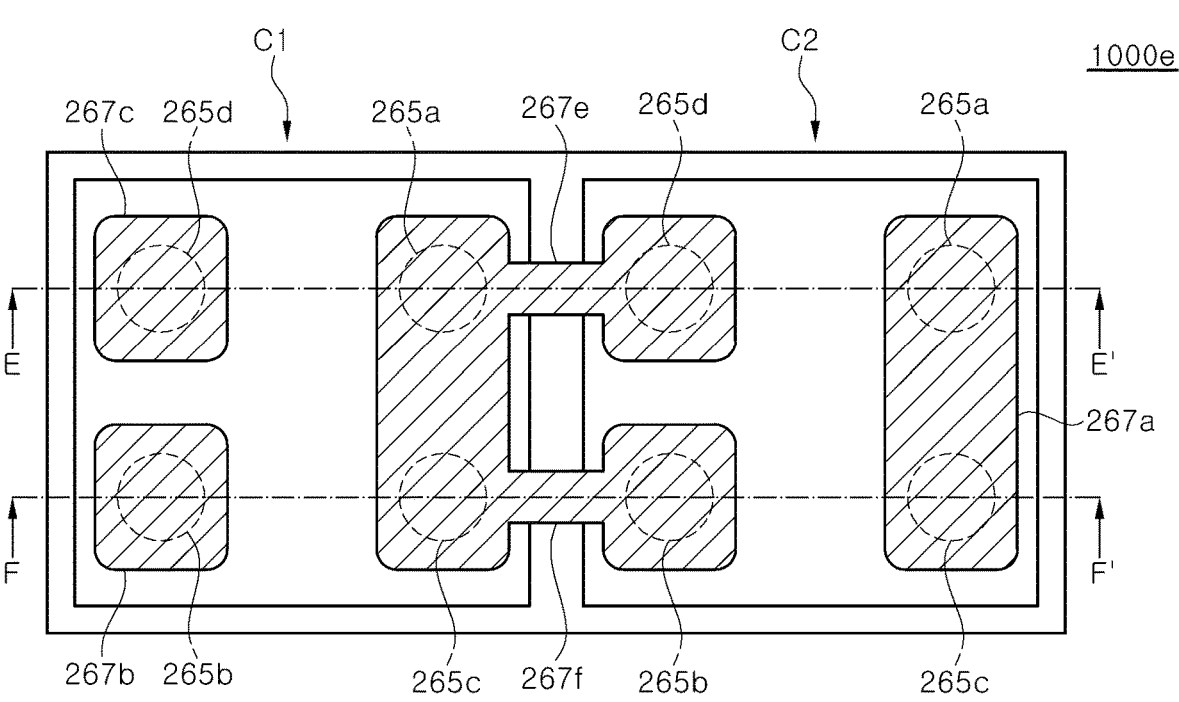
FIG. 20 is a schematic plan view of a mixed color light emitting device according to another exemplary embodiment.
Figure 21A:
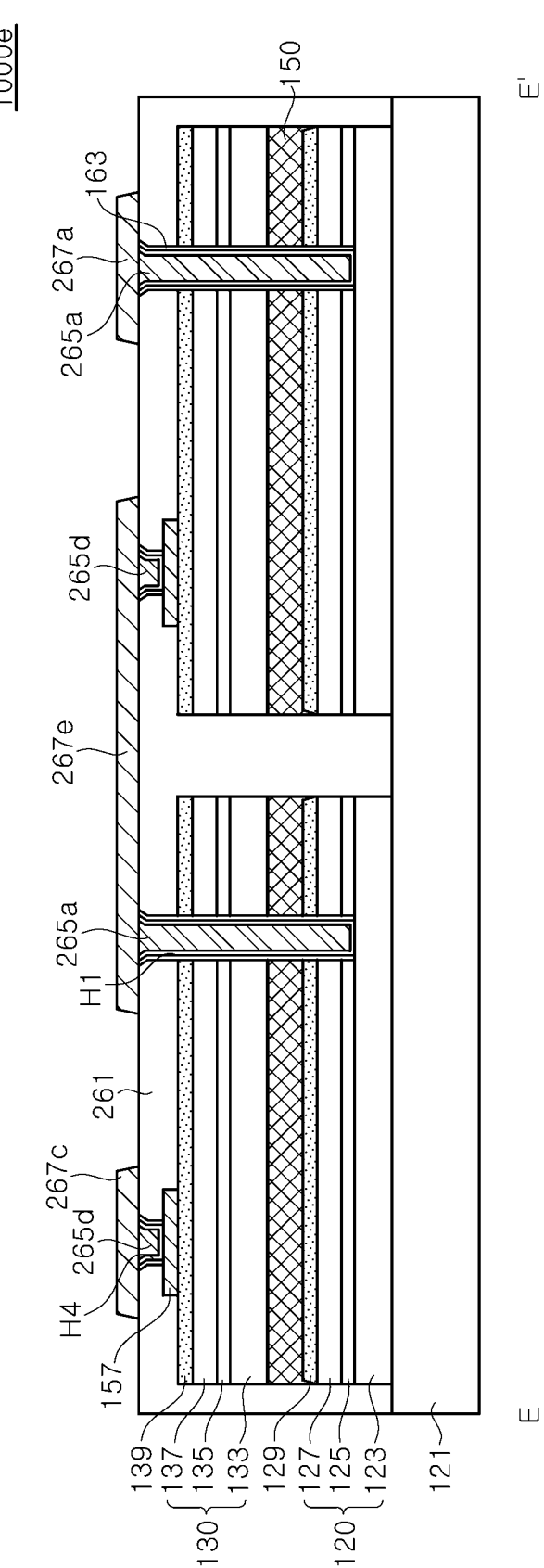
FIG. 21A is a schematic cross-sectional view taken along line E-E' of FIG. 20.
Figure 21B:
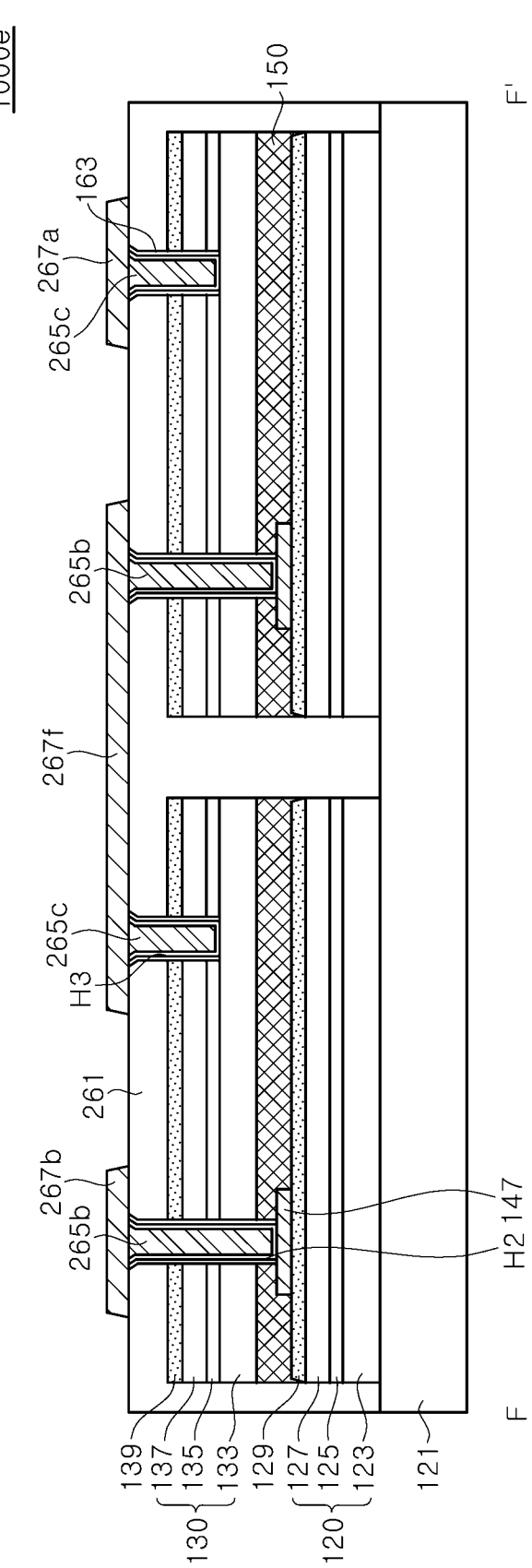
FIG. 21B is a schematic cross-sectional view taken along line F-F' of FIG. 20.
Figure 22:
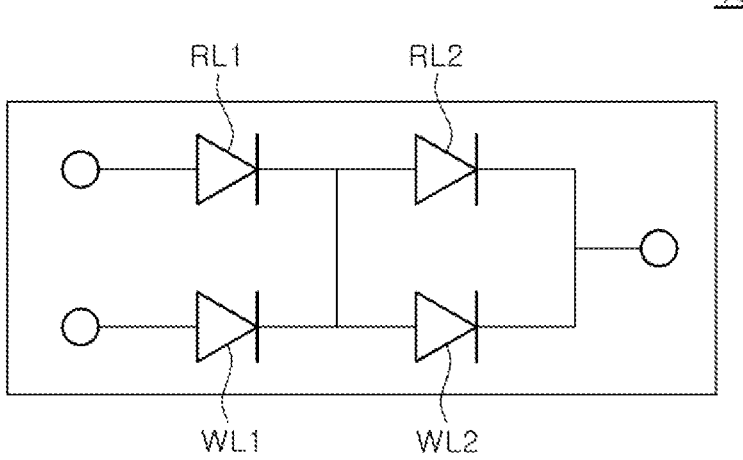
FIG. 22 is a schematic circuit diagram of the mixed color light emitting device of FIG. 20.

FIG. 20 is a schematic plan view of a mixed color light emitting device 1000e according to another exemplary embodiment, FIG. 21A is a schematic cross-sectional view taken along line E-E' of FIG. 20, and FIG. 21B is a schematic cross-sectional view taken along line F-F' of FIG. 20. FIG. 22 is a schematic circuit diagram of the mixed color light emitting device of FIG. 20.

Referring to FIGS. 20, 21A, and 21B, the mixed color light emitting device 1000e according to the illustrated exemplary embodiment is substantially similar to the mixed color light emitting device 1000a described with reference to FIGS. 14, 15A, and 15B, except that the mixed color light emitting device 1000e has a plurality of light emitting cells C1 and C2. Since a layer structure of each of the light emitting cells C1 and C2 is substantially similar to that of the mixed color light emitting device 1000a, repeated descriptions thereof will be omitted.

The light emitting cells C1 and C2 are spaced apart from each other on a substrate 121. After a first semiconductor stacked structure 120 and a second semiconductor stacked structure 130 are bonded using an insulation layer 150, a second transparent electrode 139, the second semiconductor stacked structure 130, the insulation layer 150, a first transparent electrode 129, and the first semiconductor stacked structure 120 may be sequentially etched to form the light emitting cells C1 and C2 spaced apart from each other.

A planarization layer 261 may cover the substrate 121 in an isolation region between the light emitting cells C1 and C2 together with the light emitting cells C1 and C2. An upper surface of the planarization layer 261 may be flat.

As described with reference to FIGS. 14, 15A, and 15B, through holes H1, H2, H3, and H4 and a sidewall insulation layer 163 are formed in each of the light emitting cells C1 and C2, and buried vias 265a, 265b, 265c, and 265d are formed in the through holes H1, H2, H3, and H4.

In addition, as described with reference to FIGS. 14, 15A and 15B, the buried vias 265a and 265b electrically connected to a first conductivity type semiconductor layer 123 and a second conductivity type semiconductor layer 127 of the first semiconductor stacked structure 120 are disposed in a diagonal direction in each of the light emitting cells C1 and C2. Moreover, the buried vias 265c and 265d electrically connected to a first conductivity type semiconductor layer 133 and a second conductivity type semiconductor layer 137 of the second semiconductor stacked structure 130 are disposed in the diagonal direction in each of the light emitting cells C1 and C2. By disposing the buried vias 265a and 265*b* connected to the first semiconductor stacked structure 120 and the buried vias 265*c* and 265*d* electrically connected to the second semiconductor stacked structure 130 in the diagonal direction, it is possible to facilitate spreading of currents in the stacked structure 120 and the second semiconductor stacked structure 130, and thus, luminous efficiency may be increased.

Subsequently, connectors 267*e* and 267*f* may be formed together with bonding pads 267*a*, 267*b*, and 267*c*. The bonding pad 267*a* may be disposed on the second light emitting cell C2, and may be electrically connected to the first conductivity type semiconductor layers 123 and 133 through the buried vias 265*a* and 265*c* in the second light emitting cell C2.

The bonding pad 267*b* and the bonding pad 267*c* may be disposed on the first light emitting cell C1, and may be electrically connected to the buried vias 265*b* and 265*c*, respectively.

Meanwhile, the connectors 267*e* and 267*f* electrically connect the first light emitting cell C1 and the second light emitting cell C2. More particularly, the connector 267*e* electrically connects the buried vias 265*a* and 265*c* of the first light emitting cell C1 and the buried via 265*d* of the second light emitting cell C2 to one another, and the connector 267*f* electrically connects the buried vias 265*a* and 265*c* of the first light emitting cell C1 and the buried via 265*b* of the second light emitting cell C2 to one another.

As such, as shown in FIG. 22, the mixed color light emitting device 1000*e* is provided, in which a first light emitting portion WL1 and a second light emitting portion RL1 of the first light emitting cell C1, and a first light emitting portion WL2 and a second light emitting portion RL2 of the second light emitting cell C2 are connected in series-parallel. In particular, the first light emitting portion WL1 of the first light emitting cell C1 and the first conductivity type semiconductor layers 123 and 133 of the second light emitting portion RL1 are electrically connected to one another, and further, the first light emitting portion WL2 of the second light emitting cell C2 and the second conductivity type semiconductor layers 127 and 137 of the second light emitting portion RL2 are also electrically connected.

In the illustrated exemplary embodiment, although the through holes H1, H2, H3, and H4 are described as being formed in each of the light emitting cells C1 and C2, the inventive concepts are not necessarily limited thereto. For example, in some exemplary embodiments, instead of forming the through holes, the first and second conductivity type semiconductor layers 123, 133, 127, and 137 or the first and second transparent electrodes 129 and 139 may be exposed using various techniques, such as mesa etching or the like, and electrical connection may be formed therebetween.

The light emitting cells C1 and C2 may be connected to each other in various methods. Hereinafter, light emitting devices connected to the light emitting cells C1 and C2 will be described using a circuit diagram.

Figure 23:
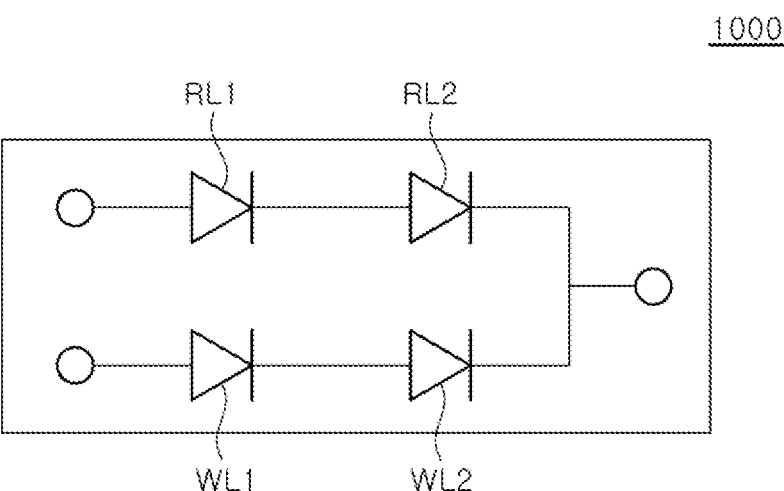
FIGS. 23, 24, and 25 are schematic circuit diagrams of mixed color light emitting devices according to exemplary embodiments.
Figure 24:
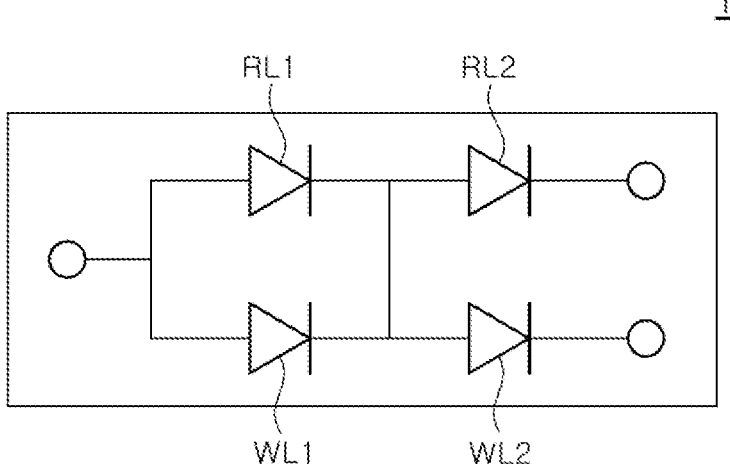
Figure 25:
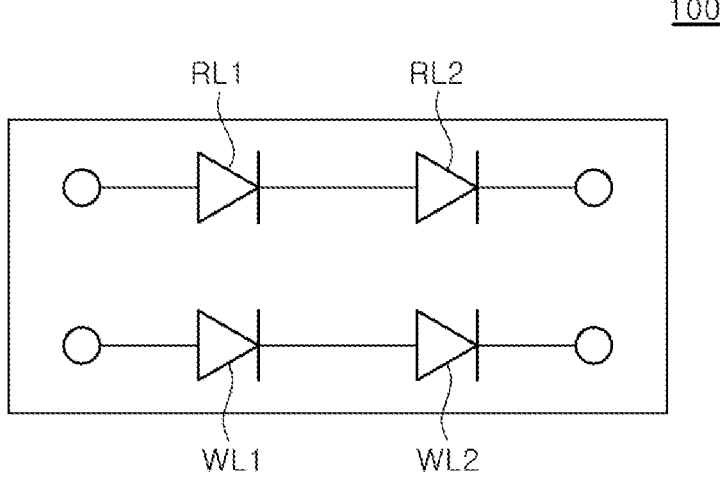

FIGS. 23 through 25 are schematic circuit diagrams illustrating mixed color light emitting devices 1000*f*, 1000*g*, and 1000*h* according to exemplary embodiments.

Referring to FIG. 23, the mixed color light emitting device 1000*f* according to the illustrated exemplary embodiment is substantially similar to the mixed color light emitting device 1000*e* described with reference to FIG. 22, except that a first light emitting portion WL1 of a first light emitting cell C1 and first conductivity type semiconductor layers 123 and 133 of a second light emitting portion RL1 are electrically isolated from one another. Further, a first light emitting portion WL2 of a second light emitting cell C2 and second conductivity type semiconductor layers 127 and 137 of a second light emitting portion RL2 are also electrically spaced apart from one another. For example, the connectors 267*e* and 267*f* shown in FIG. 20 may be separated from each other to obtain the circuit diagram shown in FIG. 23.

Referring to FIG. 24, the mixed color light emitting device 1000*g* according to the illustrated exemplary embodiment is substantially similar to the mixed color light emitting device 1000*e* described with reference to FIG. 22, except that the first light emitting portion WL1 of the first light emitting cell C1 and the second conductivity type semiconductor layers 127 and 137 of the second light emitting portion RL1 are commonly electrically connected, and the first light emitting portion WL2 of the second light emitting cell C2 and the second conductivity type semiconductor layers 127 and 137 of the second light emitting portion RL2 are electrically spaced apart from one another. The first light emitting portion WL1 of the first light emitting cell C1 and the first conductivity type semiconductor layers 123 and 133 of the second light emitting portion RL1 are commonly electrically connected, and the first light emitting portion WL2 of the second light emitting cell C2 and the first conductivity type semiconductor layers 123 and 133 of the second light emitting portion RL2 are electrically connected to one another.

Referring to FIG. 25, in the mixed color light emitting device 1000*h* according to the illustrated exemplary embodiment, the first light emitting portion WL1 of the first light emitting cell C1 is connected in series with the first light emitting portion WL2 of the second light emitting cell C2, and the second light emitting portion RL1 of the first light emitting cell C1 is connected in series with the second light emitting portion RL2 of the second light emitting cell C2. Meanwhile, the first light emitting units WL1 and WL2 and the second light emitting portions RL1 and RL2 are electrically spaced apart from one another.

Although the first light emitting portion WL1 and the second light emitting portion RL1 of the first light emitting cell C1 are described as being connected, and that the first light emitting portion WL2 and the second light emitting portion RL2 of the second light emitting cell C2 are described as being connected, the inventive concepts are not limited to the specific exemplary embodiments described above.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A light emitting device, comprising:
a first semiconductor configured to emit multi-band spectral light; and
a red light source configured to emit red light,
wherein the first semiconductor comprises:
  a first conductivity-type nitride semiconductor layer;
  an active layer disposed on the first conductivity-type nitride semiconductor layer; and
  a second conductivity-type nitride semiconductor layer disposed on the active layer,
wherein the active layer includes a multi-quantum well structure including a plurality of barrier layers, a plu- rality of well layers, and a plurality of capping layers alternately stacked one over another, wherein the plurality of well layers includes a first well layer and a second well layer, and the plurality of capping layers includes a first capping layer and a second capping layer, wherein the first capping layer is disposed on a top surface of the first well layer, and the second capping layer is disposed on a top surface of the second well layer, wherein an Al composition of a first portion of the plurality of capping layers is greater than an Al composition of a second portion of the plurality of capping layers, wherein a region of the active layer includes a V-pit structure, wherein the first portion of the plurality of capping layers is disposed over a flat surface of the V-pit structure, wherein the second portion of the plurality of capping layers is disposed in the V-pit structure, and wherein the active layer is configured to emit the multi-band spectral light.

2. The light emitting device of claim 1, wherein the red light source includes a phosphor configured to convert a wavelength of light emitted from the first semiconductor into red light.

3. The light emitting device of claim 2, further comprising a printed circuit board, wherein the first semiconductor is disposed on the printed circuit board.

4. The light emitting device of claim 3, wherein both of the first semiconductor and the phosphor are disposed at each of a plurality of locations on the printed circuit board.

5. The light emitting device of claim 1, wherein the red light source includes a second semiconductor configured to emit red light.

6. The light emitting device of claim 5, wherein the second semiconductor is spaced apart from the first semiconductor in a lateral direction.

7. The light emitting device of claim 6, further comprising a printed circuit board, wherein both of the first semiconductor and the second semiconductor are disposed at each of a plurality of locations on the printed circuit board.

8. The light emitting device of claim 5, wherein the second semiconductor is coupled to the first semiconductor by a coupling layer.

9. The light emitting device of claim 8, further comprising a substrate disposed on a side of the first semiconductor, wherein the multi-band spectral light generated from the first semiconductor and the red light generated from the second semiconductor are configured to be emitted to the outside of the light emitting device through the substrate.

10. The light emitting device of claim 9, wherein the first semiconductor and the second semiconductor are bonded by the coupling layer, and the coupling layer comprises an insulation layer or a transparent electrode.

11. The light emitting device of claim 10, further comprising:

a first bonding pad commonly electrically connected to the first semiconductor and the second semiconductor; and a second bonding pad and a third bonding pad electrically connected to the first semiconductor and the second semiconductor, respectively.

12. The light emitting device of claim 11, wherein:

the second semiconductor includes a first conductivity-type semiconductor layer and a second conductivity-type semiconductor layer;

the first bonding pad is commonly electrically connected to the first conductivity-type nitride semiconductor layer of the first semiconductor and the first conductivity-type semiconductor layer of the second semiconductor;

the second bonding pad is electrically connected to the second conductivity-type nitride semiconductor layer of the first semiconductor; and the third bonding pad is electrically connected to the second conductivity-type semiconductor layer of the second semiconductor.

13. The light emitting device of claim 12, further comprising buried vias electrically connecting the first, second, and third bonding pads to the first conductivity-type nitride semiconductor layer, the first conductivity-type semiconductor layer, the second conductivity-type nitride semiconductor layer, and the second conductivity-type semiconductor layer.

14. The light emitting device of claim 1, wherein the multi-band spectral light includes blue light and yellow light.

* * * * *